US007395461B2

(12) United States Patent
Argon et al.

(10) Patent No.: US 7,395,461 B2
(45) Date of Patent: Jul. 1, 2008

(54) LOW COMPLEXITY PSEUDO-RANDOM INTERLEAVER

(75) Inventors: Cenk Argon, Madison, WI (US); Richard Martin Born, Fort Collins, CO (US); Gregory Lee Silvus, Boulder, CO (US); Thomas Victor Souvignier, Longmont, CO (US); Peter Igorevich Vasiliev, Longmont, CO (US)

(73) Assignee: Seagate Technology LLC, Scott Valley, CA (US)

( * ) Notice: Subject to any disclaimer, the term of this patent is extended or adjusted under 35 U.S.C. 154(b) by 502 days.

(21) Appl. No.: 11/131,518

(22) Filed: May 18, 2005

(65) Prior Publication Data

US 2006/0282712 A1 Dec. 14, 2006

(51) Int. Cl.
*G06F 11/00* (2006.01)
(52) U.S. Cl. .................. 714/701; 714/702; 714/755
(58) Field of Classification Search ............... 714/701, 714/702
See application file for complete search history.

(56) References Cited

U.S. PATENT DOCUMENTS

| 4,087,626 | A | | 5/1978 | Brader ........................ 178/22 |
| 4,893,339 | A | * | 1/1990 | Bright et al. ................. 380/28 |
| 5,535,220 | A | * | 7/1996 | Kanno et al. ................ 714/701 |
| 5,659,580 | A | | 8/1997 | Partyka ...................... 375/295 |
| 5,721,745 | A | | 2/1998 | Hladik et al. ................. 371/43 |
| 5,825,832 | A | | 10/1998 | Benedetto ................... 375/341 |
| 5,881,308 | A | | 3/1999 | Dwyer, III .............. 39/800.23 |
| 5,983,385 | A | | 11/1999 | Khayrallah et al. ......... 714/755 |
| 5,996,104 | A | * | 11/1999 | Herzberg .................... 714/755 |
| 6,023,783 | A | | 2/2000 | Divsalar et al. ............. 714/792 |
| 6,035,427 | A | | 3/2000 | Kweon ........................ 714/702 |
| 6,178,530 | B1 | | 1/2001 | Aman et al. ................ 714/702 |
| 6,192,503 | B1 | | 2/2001 | Chennakeshu et al. ...... 714/796 |
| 6,289,486 | B1 | | 9/2001 | Lee et al. .................... 714/788 |
| 6,304,985 | B1 | | 10/2001 | Sindhushayanna et al. .. 714/702 |
| 6,304,991 | B1 | * | 10/2001 | Rowitch et al. ............. 714/755 |
| 6,353,900 | B1 | | 3/2002 | Sindhushayanna et al. .. 714/701 |
| 6,445,755 | B1 | | 9/2002 | Chung et al. ................ 375/341 |

(Continued)

FOREIGN PATENT DOCUMENTS

EP 1463255 A1 * 9/2004

(Continued)

OTHER PUBLICATIONS

Abbasfar et. al., Interleaver Design For High Speed Turbo Decoders, 2004, IEEE Communications Society, pp. 1611-1615.*

(Continued)

*Primary Examiner*—Mujtaba K. Chaudry
(74) *Attorney, Agent, or Firm*—Westman, Champlin & Kelly P.A.

(57) ABSTRACT

An interleaver has an input multiplexer that receives a data sequence at an interleaver input and that separates the data sequence into multiple data sub-blocks. The interleaver has a linear feedback shift register that generates an input address sequence. The interleaver has adder circuits that generate output address sequences associated with each data sub-block. The interleaver has memory that stores the data sub-blocks at addresses controlled by the input address sequence. The memory reproduces each data sub-block in an interleaved sequence controlled by the associated output address sequence. The interleaver has an output multiplexer that assembles the interleaved sequences to provide an interleaver output.

20 Claims, 32 Drawing Sheets

U.S. PATENT DOCUMENTS

| | | | |
|---|---|---|---|
| 6,493,815 B1 * | 12/2002 | Kim et al. | 711/217 |
| 6,564,343 B1 | 5/2003 | Yamashita | 714/701 |
| 6,581,182 B1 | 6/2003 | Lee | 714/795 |
| 6,591,381 B1 * | 7/2003 | Kim et al. | 714/701 |
| 6,637,000 B2 * | 10/2003 | Rowitch et al. | 714/755 |
| 6,668,026 B1 | 12/2003 | Miyauchi | 375/341 |
| 6,675,348 B1 | 1/2004 | Hammons, Jr. et al. | 714/790 |
| 6,708,308 B2 | 3/2004 | De Souza et al. | 714/795 |
| 6,721,908 B1 * | 4/2004 | Kim et al. | 714/702 |
| 6,760,390 B1 | 7/2004 | Desai et al. | 375/341 |
| 6,765,506 B1 | 7/2004 | Lu | 341/50 |
| 6,802,037 B2 | 10/2004 | Kim et al. | 714/755 |
| 6,845,482 B2 | 1/2005 | Yao et al. | 714/755 |
| 7,010,051 B2 | 3/2006 | Murayama et al. | 375/262 |
| 7,020,827 B2 | 3/2006 | Gatherer et al. | 714/786 |
| 7,050,419 B2 | 5/2006 | Azenkot et al. | 370/347 |
| 7,051,270 B2 | 5/2006 | Miyauchi et al. | 714/794 |
| 7,139,862 B2 | 11/2006 | Hemming | 711/5 |
| 7,146,545 B2 | 12/2006 | Ohbuchi et al. | 714/701 |
| 7,158,589 B2 | 1/2007 | Cameron et al. | 375/341 |
| 7,170,849 B1 | 1/2007 | Arivoli et al. | 370/208 |
| 7,180,968 B2 | 2/2007 | Miyauchi et al. | 375/341 |
| 7,191,377 B2 | 3/2007 | Berens et al. | 714/755 |
| 7,210,076 B2 | 4/2007 | Maru | 714/702 |
| 2001/0047502 A1 | 11/2001 | Hattori et al. | 714/777 |
| 2002/0021516 A1 | 2/2002 | Burns et al. | 360/46 |
| 2002/0046371 A1 | 4/2002 | Halter | 714/702 |
| 2002/0061070 A1 | 5/2002 | Cameron et al. | 375/265 |
| 2002/0154430 A1 | 10/2002 | Rae et al. | 360/25 |
| 2002/0154620 A1 | 10/2002 | Azenkot et al. | 370/347 |
| 2002/0168033 A1 | 11/2002 | Suzuki et al. | 375/341 |
| 2002/0194554 A1 | 12/2002 | Ferrari et al. | 714/701 |
| 2003/0058954 A1 | 3/2003 | He | 375/262 |
| 2003/0076873 A1 | 4/2003 | Wengerter et al. | 375/141 |
| 2003/0084398 A1 | 5/2003 | Nguyen | 714/786 |
| 2003/0097621 A1 | 5/2003 | Xin | 714/701 |
| 2003/0097633 A1 | 5/2003 | Nguyen | 714/786 |
| 2003/0126551 A1 | 7/2003 | Mantha et al. | 714/790 |
| 2003/0193966 A1 | 10/2003 | Mills | 370/476 |
| 2004/0010742 A1 | 1/2004 | Williamson et al. | 714/746 |
| 2004/0246888 A1 * | 12/2004 | Peron | 370/208 |
| 2004/0255217 A1 | 12/2004 | Garrett et al. | 714/746 |
| 2004/0264561 A1 | 12/2004 | Alexander et al. | 375/232 |
| 2005/0022090 A1 | 1/2005 | Cameron et al. | 714/755 |
| 2005/0034046 A1 | 2/2005 | Berkmann et al. | 714/755 |
| 2006/0107176 A1 | 5/2006 | Song | 714/758 |
| 2006/0123309 A1 | 6/2006 | Dinoi et al. | 714/746 |
| 2006/0156170 A1 | 7/2006 | Dinoi et al. | 714/752 |
| 2006/0156172 A1 * | 7/2006 | Kim et al. | 714/755 |

FOREIGN PATENT DOCUMENTS

| | | | |
|---|---|---|---|
| EP | 1463256 A1 * | 9/2004 | |
| JP | 2000341140 A | 12/2000 | 714/795 |
| JP | 2004215310 A | 7/2004 | 714/796 |

OTHER PUBLICATIONS

Darmon et. al., A New Pseudo-Random Interleaving for Antijamming Applications, 1989, IEEE, pp. 0006-0010.*

Fragouli et. al., Turbo-Encoder Design for Symbol-Interleaved Parallel Concatenated Trellis-Coded Modulation, 2001, IEEE, pp. 425-435.*

Claude Berrou, Patrick Adde, Ettiboua Angui and Stephane Faudeil, "A Low Complexity Soft-Output Viterbi Decoder Architecture," Proc. Of ICC 1993, pp. 737-740.

C. Berrou, A. Glavieux, and P. Thitimajshima, "Near Shannon limit error-correction coding and decoding: Turbo-codes," in Proc IEEE ICC 1993, pp. 1064-1070.

J. Hagenauer, E. Offer, and L. Papke, "Interative decoding of binary block and convolutional codes," IEEE Trans. Info. Theory, vol. 42, pp. 429-445, Mar. 1996.

R. Pyndiah, "Near-optimum decoding of product codes: block turbo codes," IEEE Trans. Commun., vol. 46, No. 8, pp. 1003-1010, Aug. 1998.

J. Hagenauer and P. Hoeher, "A Viterbi algorithm with soft-decision outputs and its applications," in Proc. IEEE Globecom '89, (Dallas, TX, Nov. 1989), pp. 1680-1686.

L.R. Bahl, J. Cocke, F. Jelinek, and J. Raviv, "Optimal decoding of linear codes for minimizing symbol error rate," IEEE Trans. Inform. Theory, vol. IT-20, pp. 284-287, Mar. 1974.

Ramesh Pyndiah, Alain Glavieux, Annie Picart and Sylvie Jacq, "Near Optimum Decoding of Product Codes," IEEE, 1994, pp. 339-343.

Engling, Yoo, Payam Pakzad, Borivoje Nikolic, Venkat Anantharam, "VLSI Architectures for Interactive Decoders in Magnetic Recording Channels," IEEE Transactions on Magnetics, vol. 37, No. 2, Mar. 2001.

U.S. Appl. No. 11/132,414, filed May 18, 2005, entitled "Iterative Detector With ECC in Channel Domain".

U.S. Appl. No. 11/131,797, filed May 18, 2005, entitled "Second Stage Sova Detector".

Chen et al., Dual-Mode Convolutional/SOVA based Turbo Code Decoder VLSI Design for Wireles Communication Systems, 2003, IEEE, pp. 369-372.

Augusburger et al., 500 Mb/s Soft Output Viterbi Decoder, 2002, ESSCIRC, pp. 523-526.

Lee et al., A Code-Aided Adaptive Equalizer Using Soft Decision-Directed Algorithm and Convolutional Coding for Fading Channels, 2001, IEEE, pp. 1664-1667.

* cited by examiner

Interleaving from Memory Perspective

Linear Feedback Shift Register (LFSR)

Implemented using a primitive polynomial of degree $N$.

Generates addresses from 1 through $2^N-1$.

Registers hold binary values 0 and 1, and modulo-2 addition is performed.

Example primitive polynomial for $N=4$: $f(D) = D^4 + D^3 + 1$ m-way Interleaving Reduced-Complexity Interleaver Reduced-Complexity Interleaver Implementation Example

Fig.8 Reduced Complexity Interleaver Characteristics

Example of Iterative Decoding Application with Interleavers

PERFORMANCE

Enhanced LFSR Characteristics

AG1 = LFSR1

AG2 = (LFSR2 + $c$) mod $2^N$

Block of data is loaded into memory buffer or unloaded from memory buffer in one time period

LOW COMPLEXITY PSEUDO-RANDOM INTERLEAVER

CROSS-REFERENCE TO RELATED APPLICATION

Cross-reference is hereby made to U.S. application Ser. No. 11/131,797, filed May 18, 2005, entitled "Second Stage SOVA Detector" (and to U.S. application Ser. No. 11/132,414, filed May 18, 2005, entitled "Iterative Detector with ECC in Channel Domain"), which were filed on even date herewith.

FIELD OF THE INVENTION

The present invention relates generally to data communication channels, and more particularly but not by limitation to such channels in data storage devices.

BACKGROUND OF THE INVENTION

Data communication channels generally include encoding of data before it passes through a communication medium, and decoding of data after it has passed through a communication medium. Data encoding and decoding is used, for example, in data storage devices for encoding data that is written on a storage medium and decoding data that is read from a storage medium. Encoding is applied in order to convert the data into a form that is compatible with the characteristics of communication medium, and can include processes such as adding error correction codes, interleaving, turbo encoding, bandwidth limiting, amplification and many other known encoding processes. Decoding processes are generally inverse functions of the encoding processes. Encoding and decoding increases the reliability of the reproduced data.

The increasing demand for high data rate communications systems and high-density data storage devices has lead to intensive focus on implementation issues of iterative decoding concepts for error-correction codes (ECC's). One main enabling element of the near-optimum performance of iterative codes is the random interleaver (also called data shuffler or permuter) that is placed between two or more constituent encoders/decoders, or between an outer decoder and a channel detector. In designing interleavers (including deinterleavers), there are complex design tradeoffs between design parameters such as the degree of randomness of interleaving patterns, the area of silicon used to implement the interleaver, size of memories needed to support the interleaver, the power consumption of the interleaver and the speed (or conversely the latency) of the interleaver. As the performance in the area of higher speed and lower power consumption improve in other parts of a data storage device, there is a need to advance the design of the various interleavers (including de-interleavers) in the data communication channel such that the performance of the interleavers does not limit the overall performance of new design data storage devices.

Embodiments of the present invention provide solutions to these and other problems, and offer other advantages over the prior art.

SUMMARY OF THE INVENTION

Disclosed is an interleaver comprising an input multiplexer. The input multiplexer receives a data sequence at an interleaver input. The input multiplexer separates the data sequence into multiple data sub-blocks.

The interleaver comprises a first linear feedback shift register. The first linear feedback generator generates an input address sequence. The interleaver comprises adder circuits. The adder circuits generate output address sequences associated with each data sub-block.

The interleaver comprises memory. The memory stores the data sub-blocks at addresses controlled by the input address sequence. The memory reproduces each data sub-block in an interleaved sequence controlled by the associated output address sequence.

The interleaver comprises an output multiplexer. The output multiplexer assembles the interleaved sequences to provide an interleaver output.

In one preferred embodiment, the adder circuits receive a shift register output of the first linear feedback shift register. In another preferred embodiment, the interleaver includes a second linear feedback shift register that provides a shift register output to the adder circuits.

Other features and benefits that characterize embodiments of the present invention will be apparent upon reading the following detailed description and review of the associated drawings.

DETAILED DESCRIPTION OF ILLUSTRATIVE EMBODIMENTS

In the embodiments described below, a simple and yet efficient low-complexity interleaver combines a linear feedback shift register (LFSR), modulo-adder circuits, multiple-way interleaving, and toggling of address generators. The interleaver has an input multiplexer that separates an input data sequence (block) into multiple data sub-blocks. One or more linear feedback shift registers and adders are used to generate input and output address sequences for each sub-block. The interleaver has an output multiplexer that assembles the interleaved sequences to provide an interleaver output. The sub-blocks are smaller in length than the data block and sub-block processes can run slower without loss of overall speed for the block, reducing power consumption without loss of speed. The size of memories in the interleaver are smaller, reducing the area of silicon used and reducing power consumption.

Figure 1A:
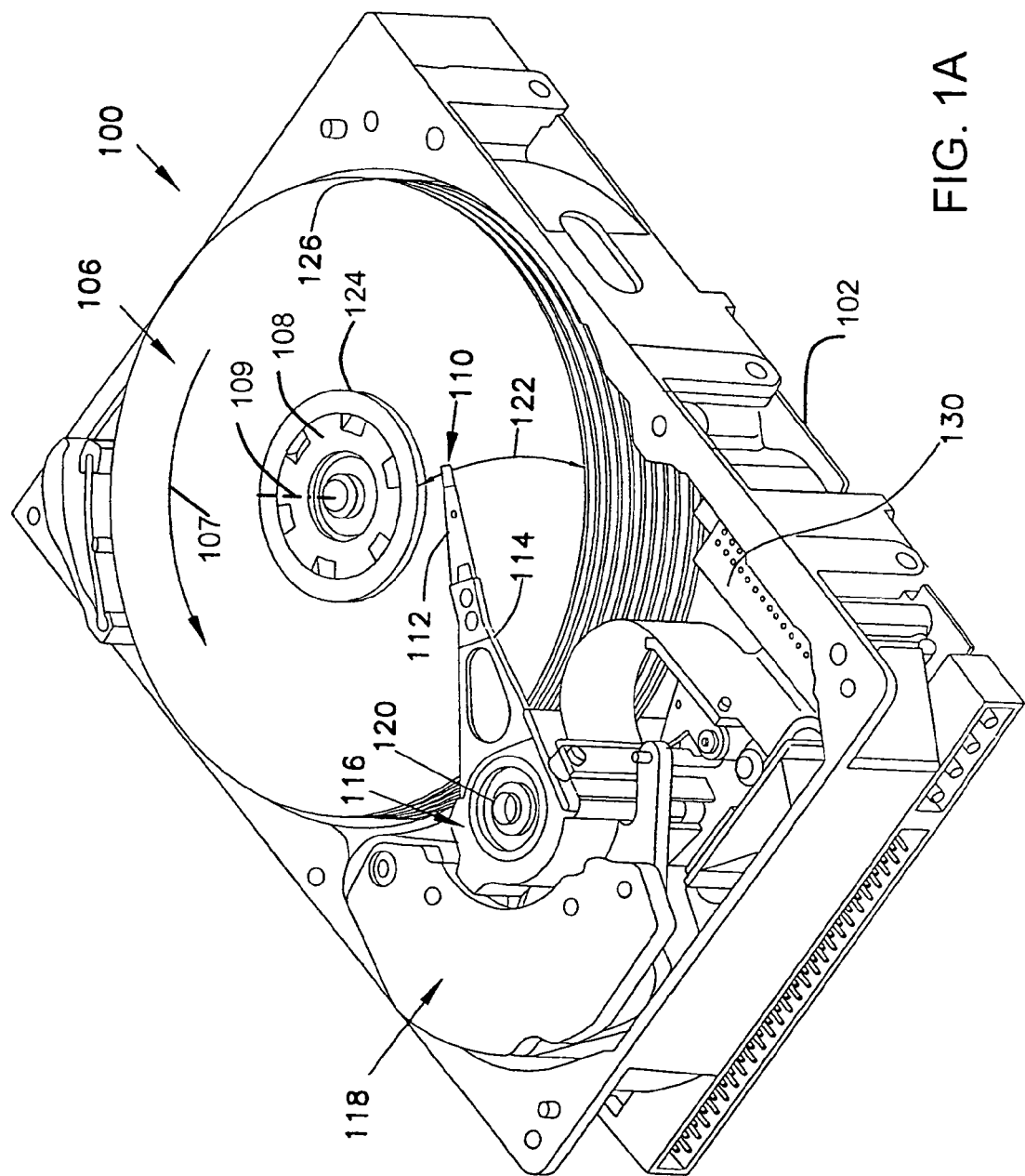
FIG. 1A is an isometric view of a disc drive.

FIG. 1 is an isometric view of a disc drive 100 in which embodiments of the present invention are useful. Disc drive 100 includes a housing with a base 102 and a top cover (not shown). Disc drive 100 further includes a disc pack 106, which is mounted on a spindle motor (not shown) by a disc clamp 108. Disc pack 106 includes a plurality of individual discs, which are mounted for co-rotation about central axis 109 in a direction indicated by arrow 107. Each disc surface has an associated disc head slider 110 which is mounted to disc drive 100 for communication with the disc surface. In the example shown in FIG. 1, sliders 110 are supported by suspensions 112 which are in turn attached to track accessing arms 114 of an actuator 116. The actuator shown in FIG. 1 is of the type known as a rotary moving coil actuator and includes a voice coil motor (VCM), shown generally at 118. Voice coil motor 118 rotates actuator 116 with its attached heads 110 about a pivot shaft 120 to position heads 110 over a desired data track along an arcuate path 122 between a disc inner diameter 124 and a disc outer diameter 126. Voice coil motor 118 is driven by servo electronics 130 based on signals generated by heads 110 and a host computer (not shown). A read/write portion of the circuitry in the disc drive 100 forms a communication channel that communicates through the medium of reading and writing data on the discs. The read/write portion of the circuitry includes interleavers such as those described below.

Figure 1B:
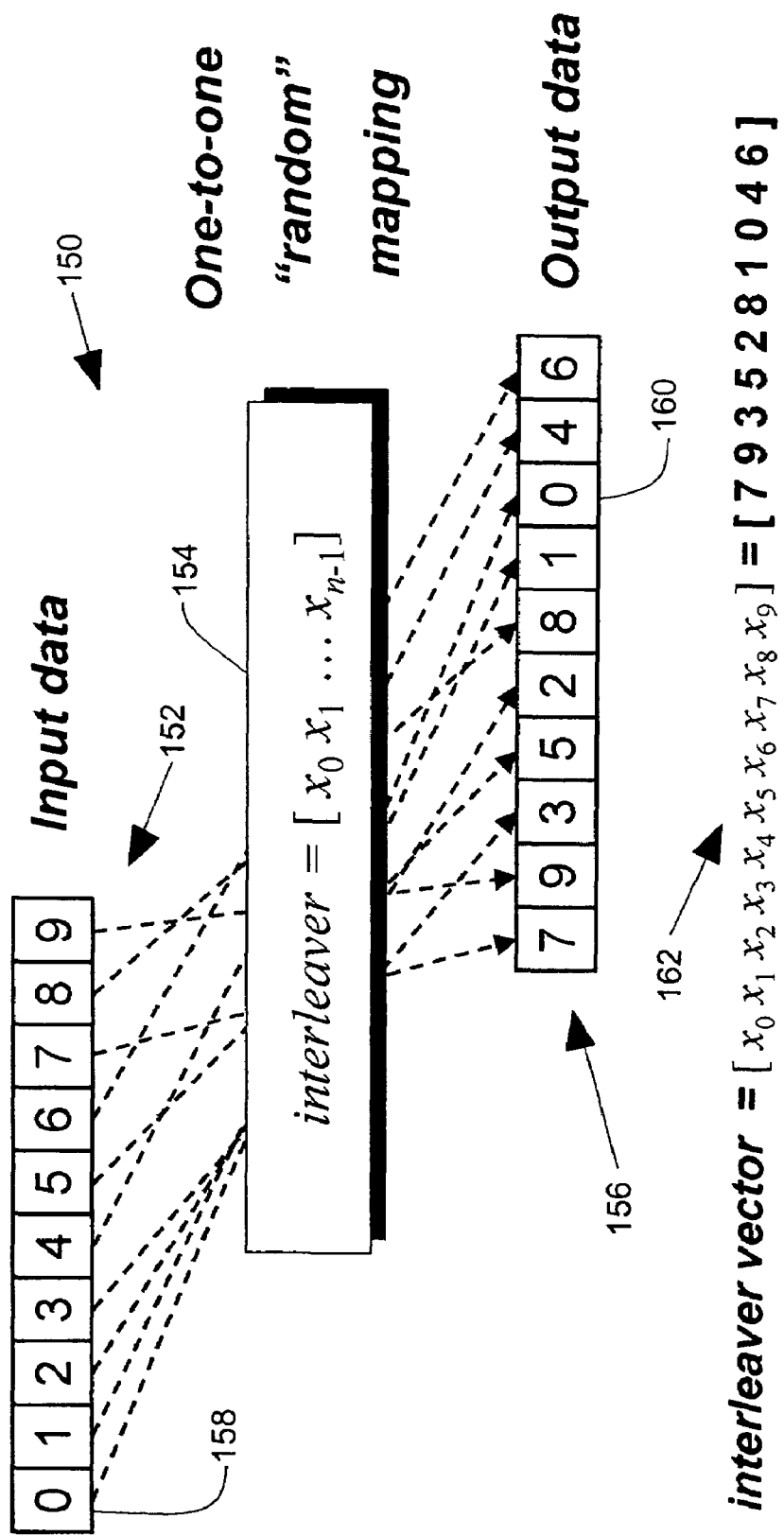
FIG. 1B illustrates an interleaver.

FIG. 1B illustrates a random interleaver 150 for use in communications and/or data storage systems. Sequential input data sequence 152 is passed through an interleaver block 154 that performs a one-to-one "pseudo-random" mapping between the input data sequence 152 and an output data sequence 156. The interleaver block 154 generates the output data sequence which places data in a different sequence or order than the input data sequence 152. At the input of the interleaver 154, a first bit 0 is in a first bit position 158, and at the output of the interleaver 154, the bit 0 is randornly positioned at an eighth bit position 160. While the pattern of the interleaver is disordered or "pseudo-random," the random pattern itself is fixed and known such that a reverse interleaver function can be performed (at a later processing stage) on the output data sequence 156 in order to accurately reproduce the input data sequence 152. The disordering performed by the interleaver 150 tends to reposition any given data word in the sequence such that the given data word is unlikely to be adjacent data words that were nearby in the input data sequence.

As illustrated in FIG. 1B at 162, an interleaver vector is defined as $[x_0 \, x_1 \ldots X_n\text{-}]$, where n is the size of the data block to be interleaved, and the $x_i$'s specify the number of the input bit position that is moved to each sequential output bit position. The interleaver vector 162 defines input-output position mapping. For example, if $x_0=7$, this means that input bit position 7 is mapped to output bit position 0. Ideally, the $x_i$'s are uniformly distributed random numbers, as described below in connection with FIG. 2.

Figure 2:
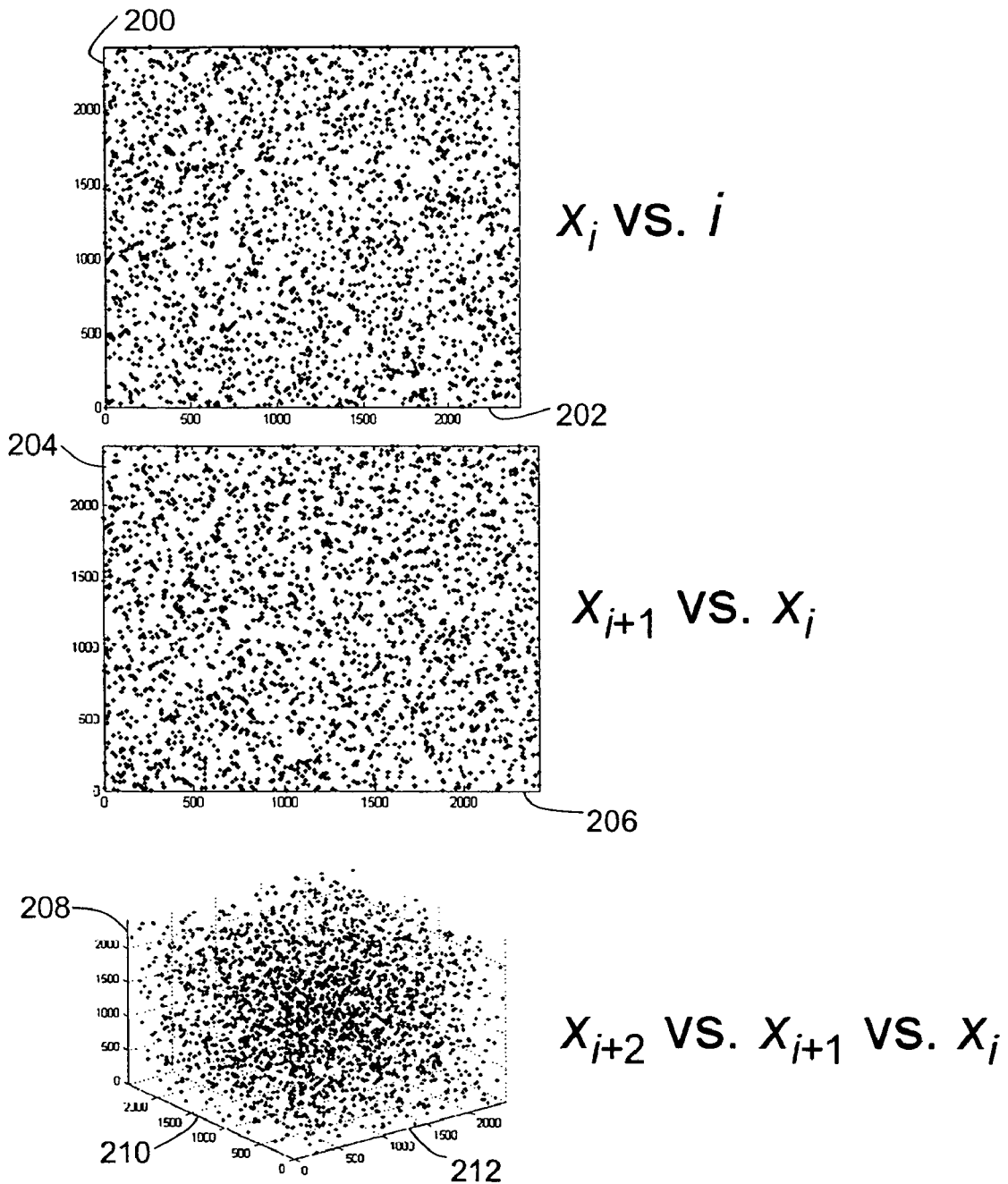
FIG. 2 illustrates mapping of interleaver outputs.

FIG. 2 graphically illustrates the mapping of $x_i$ (axis 200) as a function of i (axis 202) which can be seen to have a pseudo-random, disordered distribution. A mapping of $x_{i+1}$ (axis 204) as a function of $x_i$ (axis 206) can also be seen to have a pseudo-random, disordered distribution. A mapping of $x_{i+2}$ (axis 208) vs. $x_{i+1}$ (axis 210) vs. $x_i$ (axis 212) characteristics can also be seen to have a pseudo-random, disordered distribution generated with a uniform random number generator. Generally, sequential inputs positions are moved by the interleaver to non-sequential output positions. The data points shown in these characteristics are distributed as "uniformly" as possible.

Figure 3:
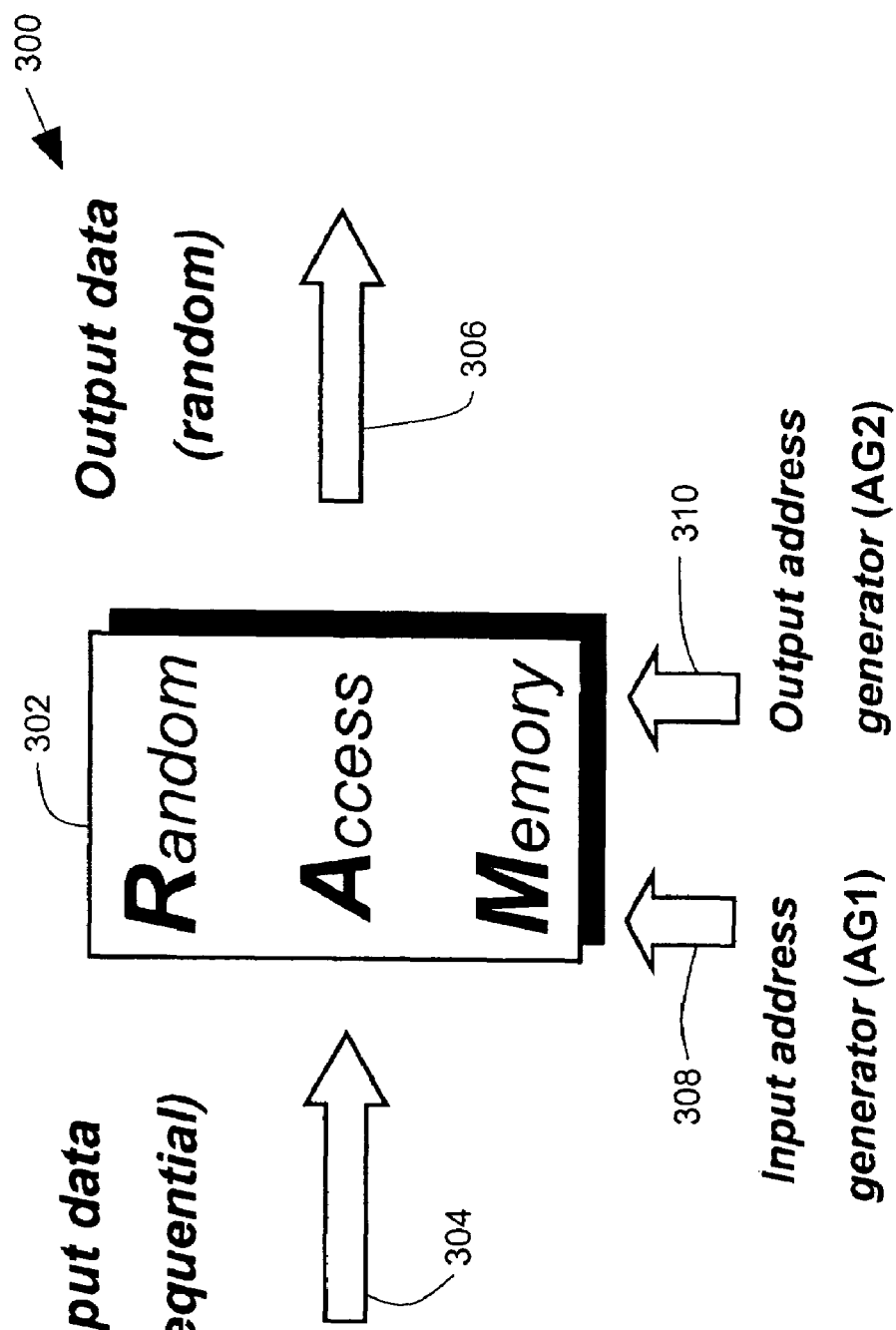
FIG. 3 illustrates a block diagram of an interleaver.

FIG. 3 illustrates an example of an interleaver 300. The interleaver 300 comprises a random access memory 302 that has a data input 304 and an interleaved data output 306. The random access memory (RAM) 302 also has a first address input 308 that receives an address from an address generator AG1 that selects an address in the RAM 308 to store a current data input 304. The RAM 308 also has a second address input 310 that receives an address from an address generator AG2 that selects an address in the RAM 308 to retrieve a current interleaved data output 306. The second address input 310 has a different sequence than the first address input 308, resulting in non-sequential disorder in the output data sequence 306. From a memory perspective, the data to be interleaved is written into the RAM 308, or other suitable type of storage medium, with an input address generator AG1; afterwards, the data is read out from the memory with an output address generator AG2. A linear feedback shift register (LFSR), configured using a primitive polynomial, can be used to generate the input address 308 or output address 310 (or both) for the RAM 302. The LSFR is described in more detail below in connection with FIG. 4.

Figure 4:
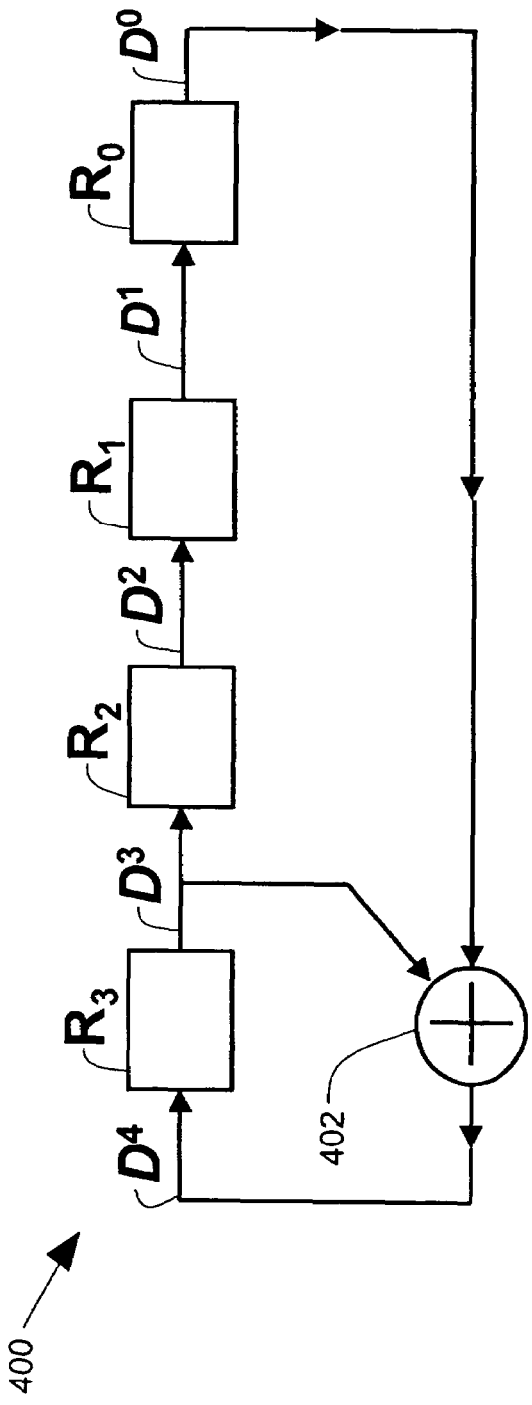
FIG. 4 illustrates a block diagram of a linear feedback shift register.

FIG. 4 shows an example of a linear feedback shift register 400 implemented with an exemplary primitive polynomial of degree N=4. The LFSR 400 comprises clocked shift register stages (e.g., clocked n-bit registers) R0, R1, R2, R3 that are connected in cascade to form a four stage shift register. An adder receives shift register outputs D0=1, D3 and provides adder output D4 back to the shift register input. The LFSR 400 is implemented with a primitive polynomial to generates all (decimal-equivalent) addresses from 1 through $2^N-1$. Here it is assumed that the register contents are in binary format and that they are converted to their decimal-equivalent values. To achieve an interleaver size of $n=2^N$, a $0^{th}$ address position is provided in the address generation. The generated addresses are derived from the states that the LFSR 400 is clocking through with each clock cycle. The polynomial illustrated in FIG. 4 is merely exemplary, and other polynomials can be used.

Although the LFSR 400 is an efficient and fast address generation method, its randomness alone is not optimal. Furthermore, given a large block of data to be interleaved, using a single address generator for the whole block puts stringent constraints on the data throughput that can be achieved with such an interleaving approach. These stringent constraints on data throughput are relieved as described below in connection with FIGS. 5A-7.

Figure 5A:
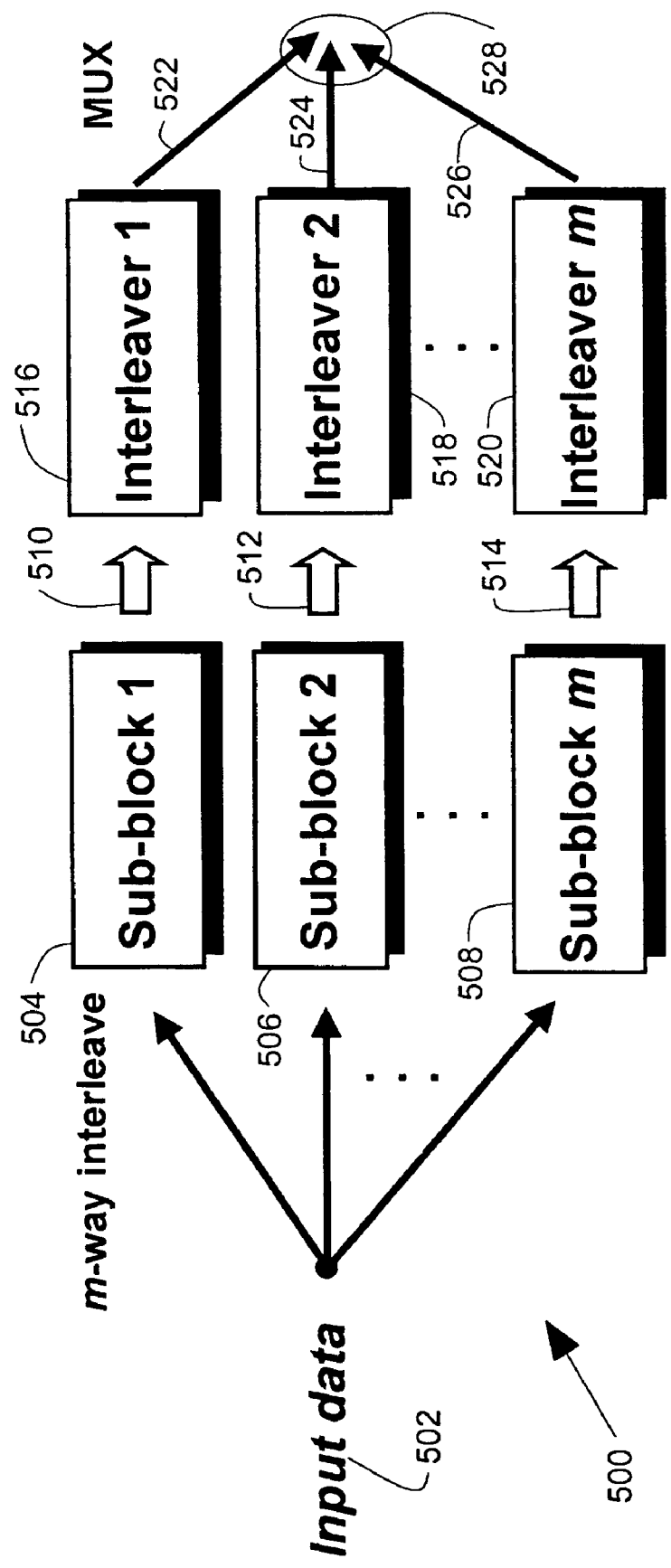
FIG. 5A illustrates a block diagram of a portion of a multiple-way interleaver.

FIGS. 5A-7 illustrates a multiple-way (or m-way) interleaver 500 with high throughput using a combination of multiple-way interleaving, LFSR address generation with adder circuits, and toggled address generation. In FIG. 5A, the input data 502 is m-way interleaved (or de-multiplexed) to form m sub-blocks 504, 506, ..., 508. With the arrangement in FIG. 5A, every jth input bit position of the input data 502 is sent to the jth sub-block. These sub-blocks 504, 506, ..., 508 provide sub-block outputs 510, 512, ..., 514 that are coupled to respective sub-block interleavers 516, 518, ..., 520. The sub-block interleavers 516, 518, ..., 520 provide interleaved sub-block outputs 522, 524, ..., 526. The interleaved sub-block outputs 522, 524, ..., 526 together comprise an interleaved output of the interleaver 500. The approach in FIG. 5A ensures that the interleaver data rates are (1/m)th of the original input data rate; hence, the address generators of the interleavers and the memories can operate at a lower clock frequency. After interleaving on the sub-block level, the data is multiplexed to form the "randomly" interleaved output data 528. An example of address generation for the interleaver 500 is described below by way of an example in FIG. 6.

Figure 5B:
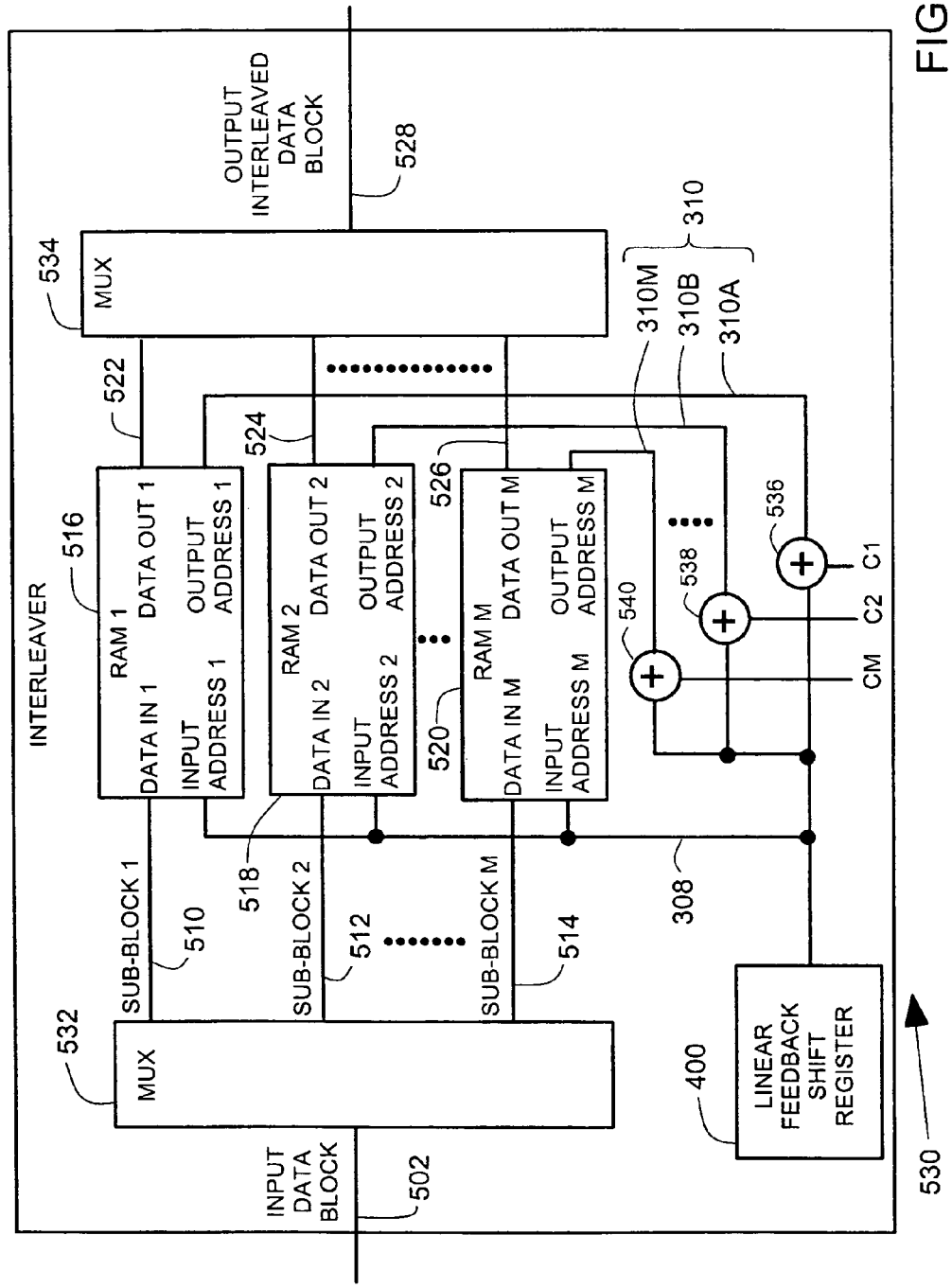
FIG. 5B illustrates a block diagram of a multiple-way interleaver.

FIG. 5B illustrates an example of an interleaver 530 that includes various aspects of circuits shown in FIGS. 3, 4, 5A. Reference numbers used in FIG. 5B that are the same as reference number used in FIGS. 3, 4, 5A identify the same or similar features. The interleaver 530 comprises an input multiplexer 532 receiving a data sequence at an interleaver input 502 and separating the data sequence into multiple data sub-block outputs 510, 512, 514. A linear feedback shift register 400 generates an input address sequence output 308. Adder circuits 536, 538, 540 receive the input address sequence output 308. Each adder circuit 536, 538, 540 also receives a corresponding constant C1, C2, CM and generates output address sequences 310A, 310B, ..., 310M (collectively, 310) associated with each data sub-block. Memories 516, 518, 520 store the data sub-blocks inputs 510, 512, 514 at addresses controlled by the input address sequence output 308. The memory reproduces each data sub-block at interleaved sequence outputs 522, 524, 526 that are controlled by the associated output address sequence outputs 310A, 310B, 310M. An output multiplexer 534 assembles the interleaved sequence outputs 522, 524, 526 to provide an interleaver output 528.

Figure 6:
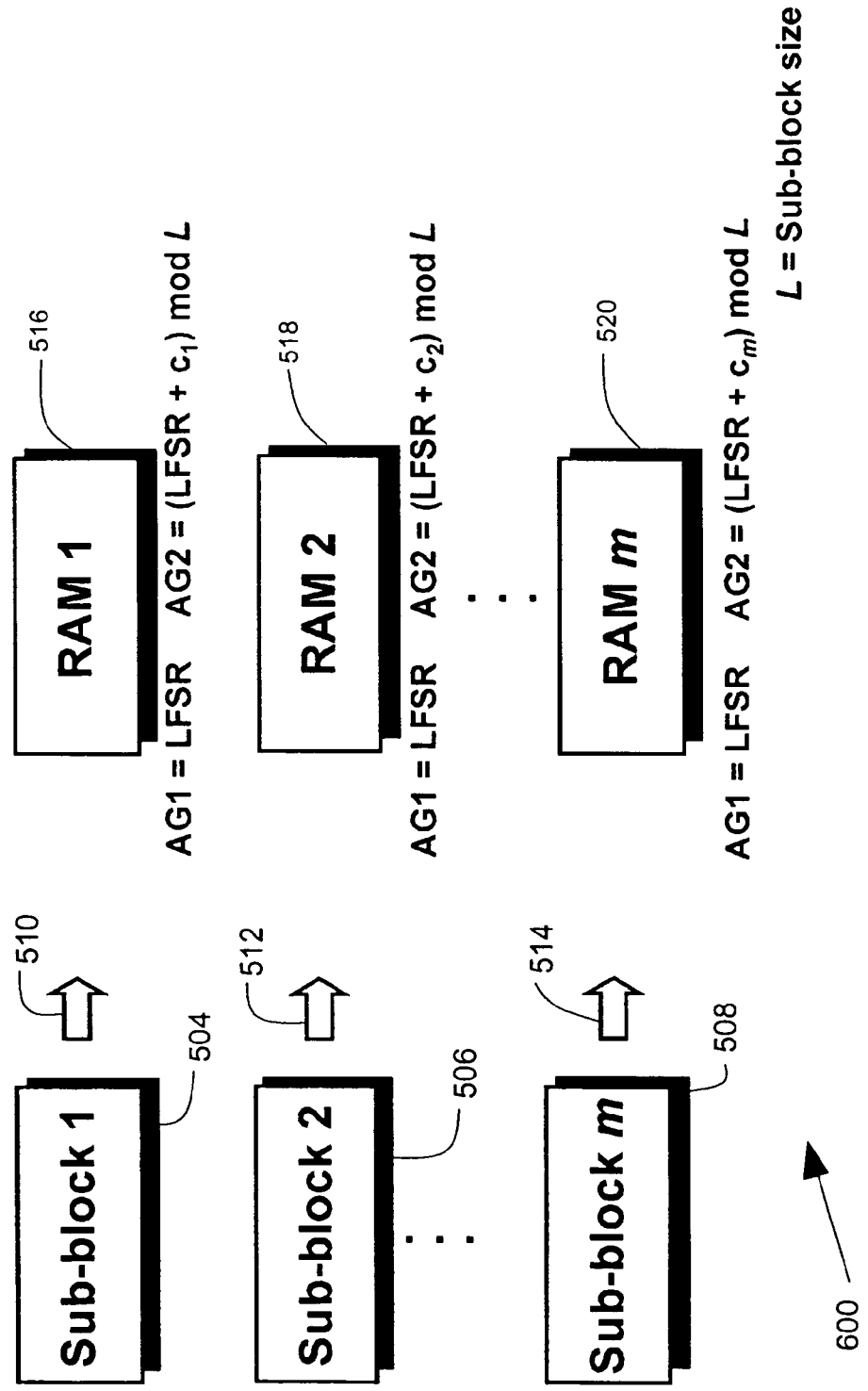
FIG. 6 illustrates an address generation architecture for a multiple-way interleaver.

FIG. 6 illustrates an address generation architecture 600. Reference numbers used in FIG. 6 that are the same as reference number used in FIGS. 5A-5B identify the same or similar features. For each sub-block interleaver 516, 518, 520, a first address generator AG1 (for input addressing) is a common LFSR for all of the sub-block interleavers 516, 518, 520. This use of a common LFSR ensures that a single LFSR can serve all sub-blocks. Since only a single LFSR is needed for all sub-blocks, this has the net effect that significant area is saved in an integrated circuit implementation. For the second address generator (for output addressing) AG2, the following addresses can be used:

$$AG2 = (LFSR + c_k) \bmod L, \quad \text{Equation 1}$$

where L is the sub-block length, $c_k$ is a constant, k is the sub-block index 1, 2, ..., m, and LFSR denotes the decimal equivalent of the linear feedback shift register state. For the second address generator, again the same LFSR is used for all sub-blocks with the minor difference that the added constants $c_k$ for each sub-block are different. This again enables significant savings in the implementation complexity since additional LFSR blocks are not needed.

Figure 7:
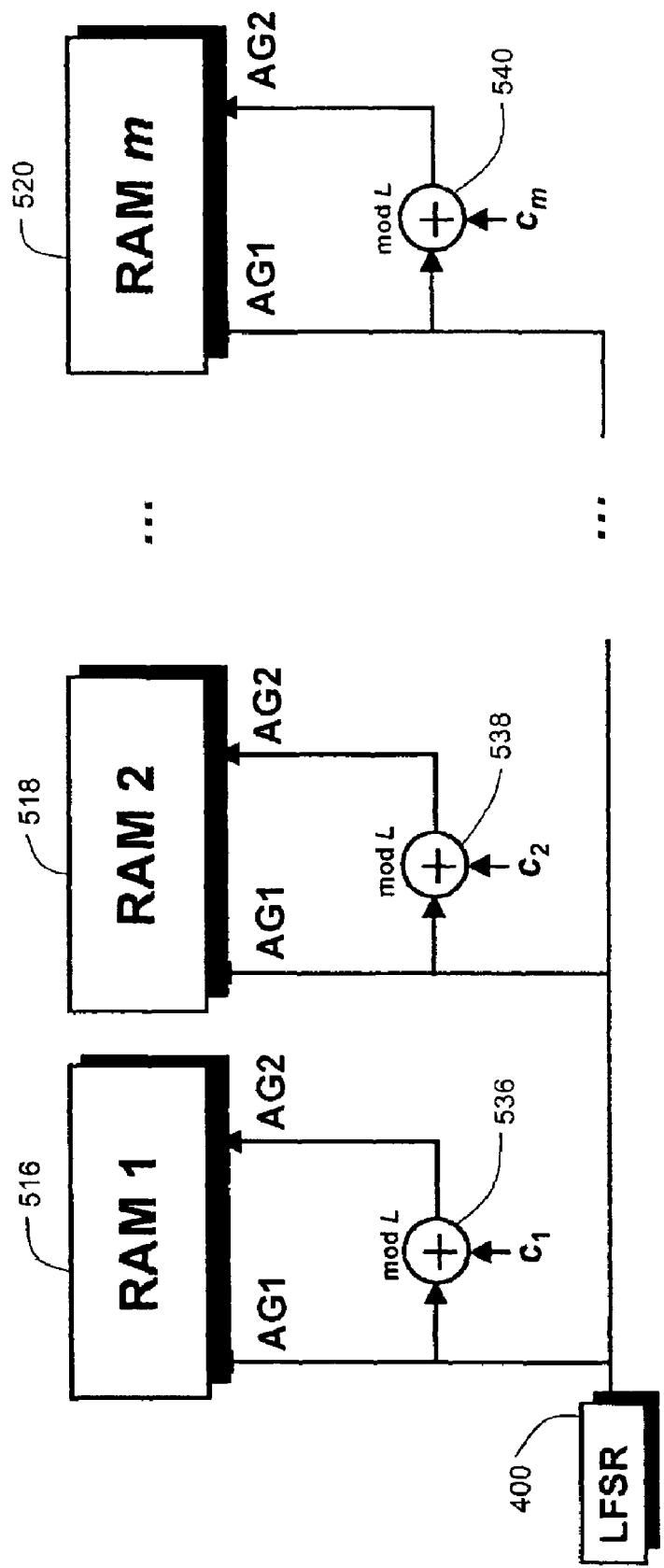
FIG. 7 illustrates an address generator for a multiple-way interleaver.

FIG. 7 schematically illustrates an example of the overall address generation. Reference numbers used in FIG. 7 that are the same as reference number used in FIGS. 5A-6 identify the same or similar features. An LFSR 400 generates addresses within a range of 0 through $2^N-1$. To achieve a general sub-block size of L, look-ahead logic circuits can be used to enable address generation within a specified range. The modulo-addition shown above in Equation 1 ensures that data written into the memory with AG1 and read out with AG2 describes a random mapping of input-output bit positions. For address generation, a distinction is made between AG1 and AG2 for each sub-block interleaver. In a practical hardware implementation, the following approach can be used in order to halve the interleaver memory requirement, while writing into the memory, it is also possible to read out the already present memory content with the same address generator. Say for example data block 1 and data block 2 are to be interleaved, and data block 1 is written with AG1 into the memory content. Now, while reading out data block 1 with AG2, data block 2 is written into the same memory with AG2 since the memory is instantly cleared. When data block 3 arrives, data block 2 is read with AG1 while writing data block 3 into the memory with AG1. This whole approach has the net effect that data block 1 is interleaved with AG1 followed by AG2, whereas data block 2 is interleaved with AG2 followed by AG1; or in general, odd numbered data blocks are interleaved with AG1 followed by AG2, whereas even numbered data blocks are interleaved with AG2 followed by AG1. As a summary, the interleaver architecture of FIGS. 5A-7 is a combination of m-way interleaving, LFSR address generation, modulo-adder circuits, and address toggling. The result is an architecture that achieves high throughput, low-complexity, low memory requirements, and near-optimum performance.

Figure 8:
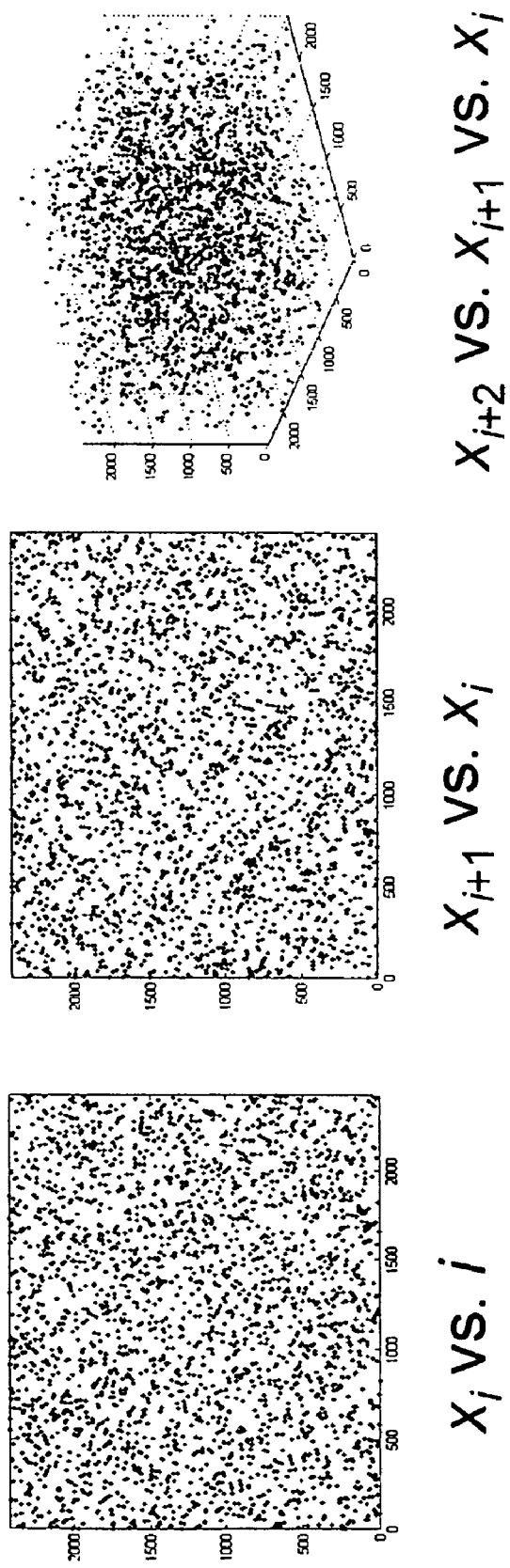
FIG. 8 illustrates mapping of multiple-way interleaver outputs.

FIG. 8 demonstrates the effectiveness of the approach in FIGS. 5A-7. FIG. 8 illustrates the $x_i$ vs. i, $x_{i+1}$ vs. $x_i$, and $x_{i+2}$ vs. $x_{i+1}$ vs. $x_i$ characteristics for the case of an interleaver with an LFSR of degree 8 and combine this with 10-way interleaving. The constants (i.e., $c_k$'s) were chosen to be 10 distinct prime numbers, and the sub-block size was 242. The data points are as uniformly distributed as for the pseudo-random case shown in FIG. 2.

Figure 9:
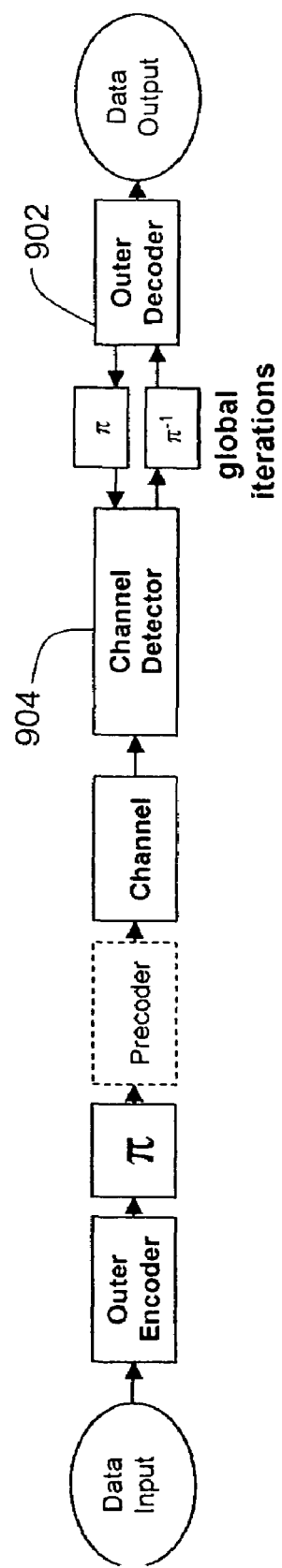
FIG. 9 illustrates an exemplary communication channel.

FIG. 9 illustrates a communication channel 900 in a data storage system example to assess the performance in an iterative architecture. Here, interleavers and de-interleavers are denoted by $\pi$ and $\pi^{-1}$, respectively. A global iteration is defined as one (extrinsic) soft information exchange between the outer decoder 902 and the channel detector 904. Multiple global iterations refer to multiple information exchanges between these units. The channel detector 904 comprises a soft-input soft-output (SISO) detector/decoder that can be implemented using the soft-output Viterbi algorithm (SOVA), the BCJR algorithm, or any other soft-output algorithm that is able to provide reliability information.

Figure 10:
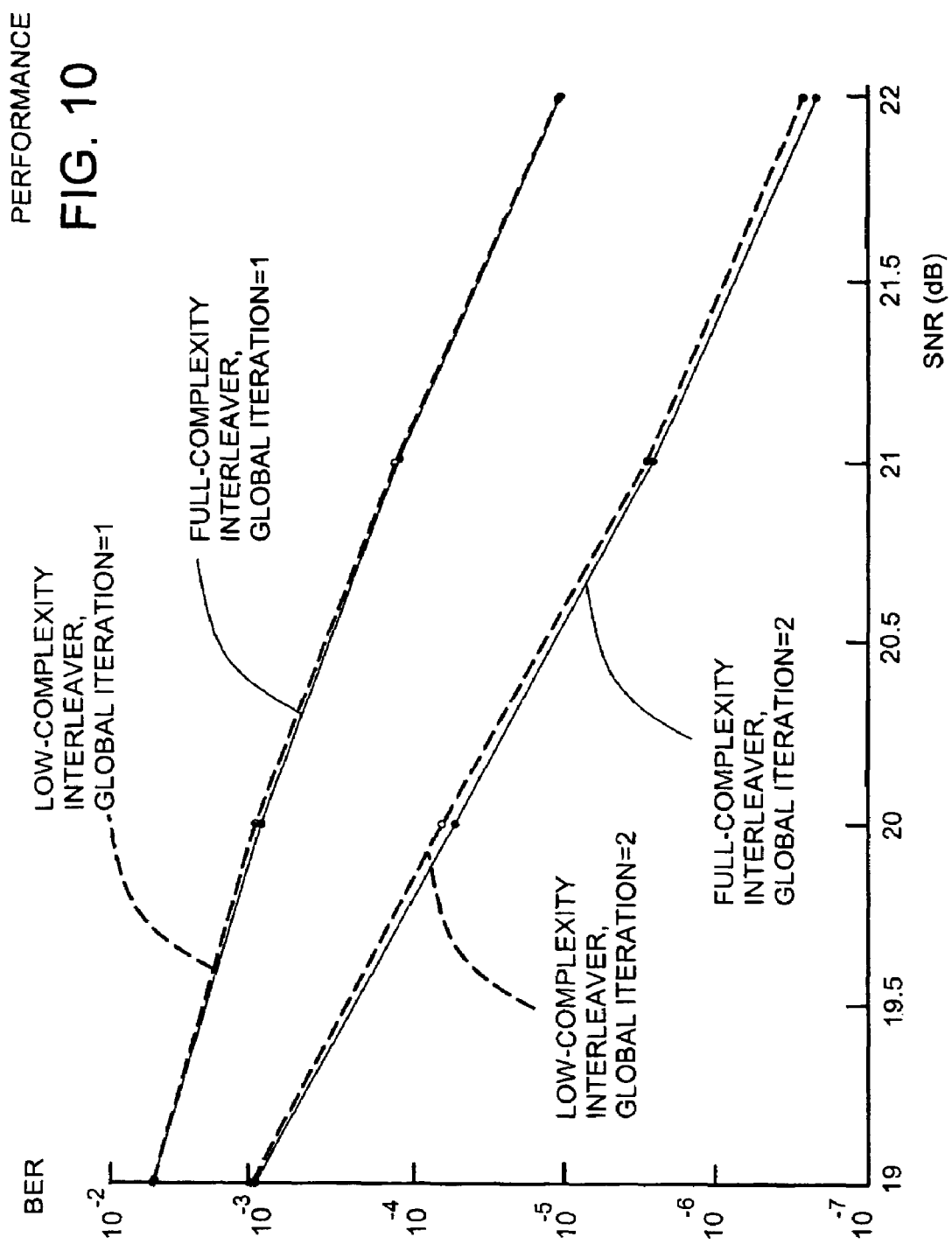
FIG. 10 illustrates output bit error rate (BER) as a function of signal-to-noise ratio for a communication channel that includes multiple-way interleavers.

FIG. 10 illustrates output bit-error-rate (BER) vs. signal-to-noise ratio (SNR) plots. For comparison purposes, the ideal pseudo-random interleaver case is included. For this ideal case, the interleaver was generated using a uniform random number generator. From the plots in FIG. 10, it can be seen that the low-complexity interleaver architecture achieves near-optimum performance at 1 and 2 global iterations, verifying the enhanced properties obtained.

FIGS. 11-15

Another type of interleaver is described below in connection with FIGS. 11-15. To enable a simple and yet efficient interleaver, an enhanced linear feedback shift register (LFSR) interleaving method can be used. Performances achieved with this type of interleaver are near-optimum. As described above in connection with FIG. 1B, ideally, the $x_i$'s are uniformly distributed random numbers. From a memory perspective, the data to be interleaved is written into a random access memory (RAM), or any other type of storage medium, with an input address generator AG1; the data is read out from the memory with an output address generator AG2, as described above in connection with FIG. 3.

Figure 11:
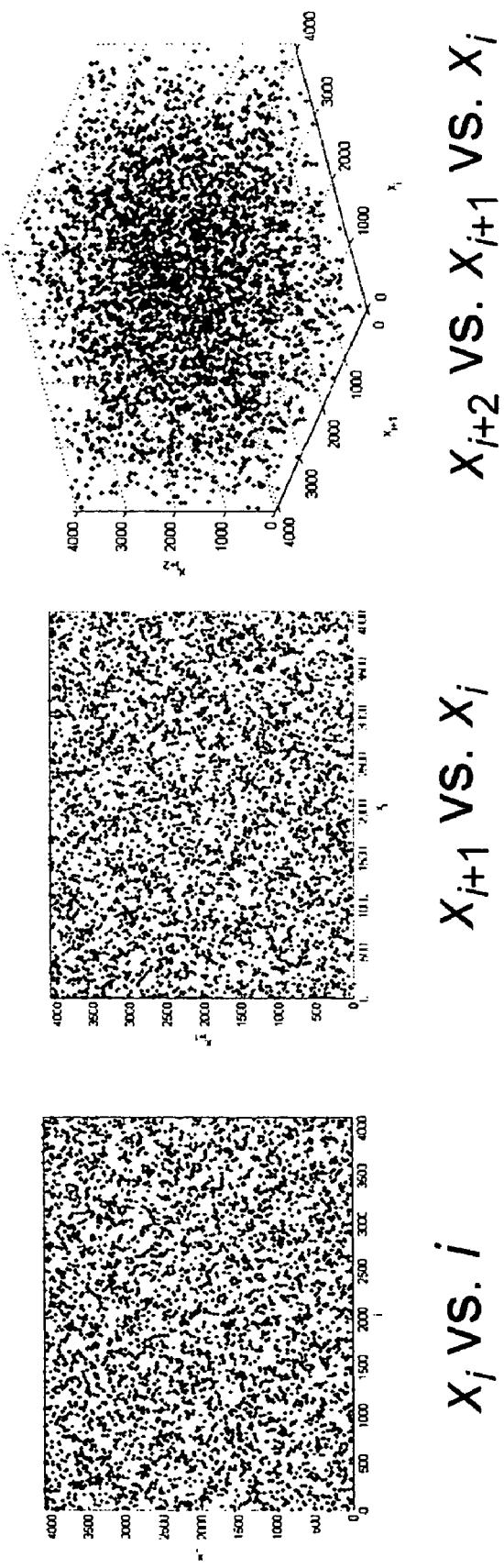
FIG. 11 illustrates mapping of interleaver outputs.
Figure 12:
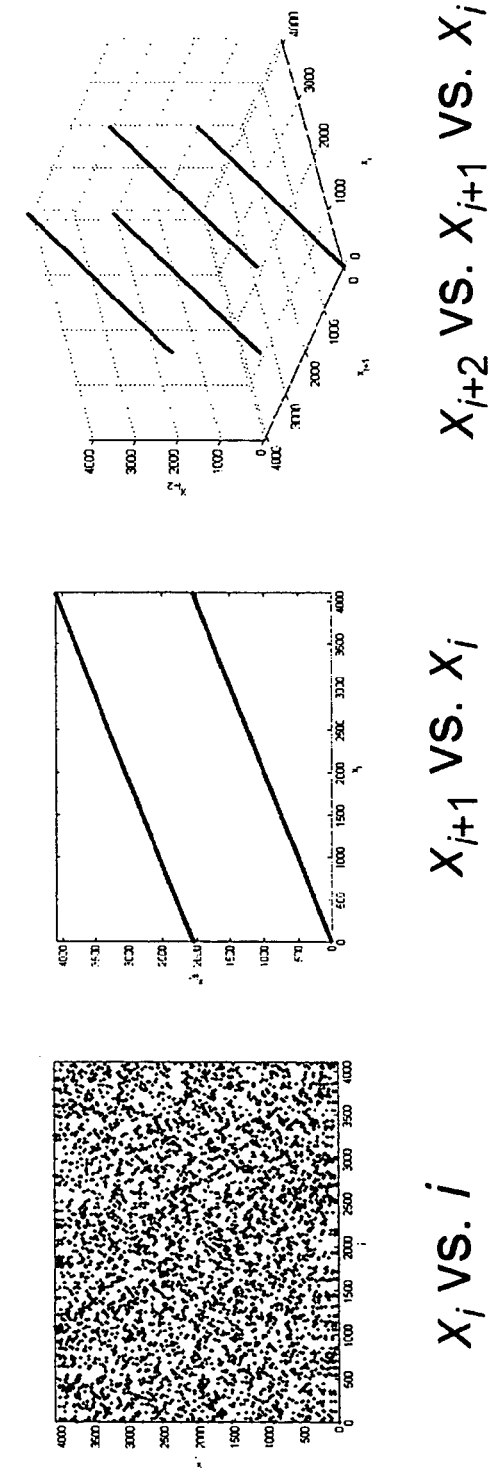
FIG. 12 illustrates mapping of interleaver outputs.

Although the LFSR is an efficient and fast address generation method, its randomness is not optimal. This is illustrated in FIG. 11 and FIG. 12 which show the $x_i$ vs. i, $x_{i+1}$ vs. $x_i$, and $x_{i+2}$ vs. $x_{i+1}$ vs. $x_i$ characteristics for a pseudo-random interleaver (generated with a uniform random number generator, FIG. 11) and an LFSR, shown in FIG. 12, respectively. It can be seen from the LFSR characteristics in FIG. 12, that the $x_{i+1}$ vs. $x_i$ and $x_{i+2}$ vs. $x_{i+1}$ vs. $x_i$ distributions are not uniform and hence, a stand-alone LFSR is not an optimal uniform random number generator. This poor LFSR property introduces significant performance degradation in iterative decoding applications.

Figure 13:
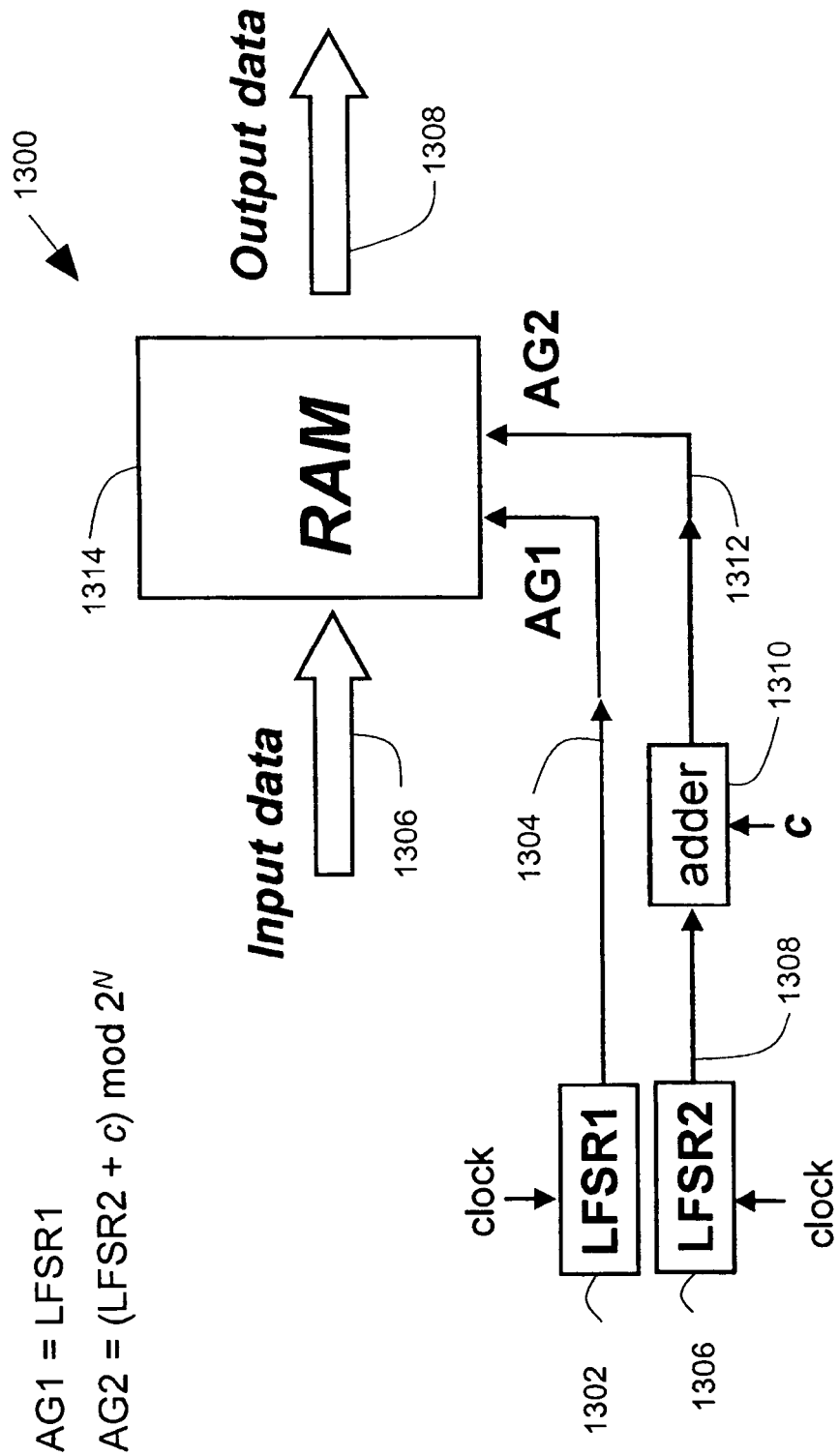
FIG. 13 illustrates a block diagram of address generation for a data sub-block using first and second linear feedback shift registers.

To enhance the characteristics of the LFSR, the architecture shown in FIG. 13 can be used. Here, two LFSRs are defined: LFSR1 and LFSR2 that are implemented with two different primitive polynomials of the same degree. Having two different LFSRs is not a requirement however, and LFSR1=LFSR2 can be used. The input address generator AG1 uses the LFSR1 output directly, whereas the output address generator AG2 is implemented via the incorporation of an adder circuit 1310. This has the net effect that the address generated for AG2 is $$AG2 = (LFSR2 + c) \bmod 2^N \qquad \text{Equation 2}$$

where c is a fixed constant and N is the degree of the primitive polynomial with which the LFSR was constructed, and LFSR2 denotes the decimal equivalent of the linear feedback shift register state. The appropriate choice of "c" can be verified via investigating the characteristics and the input-output distance spectrum of the overall interleaver vector. Furthermore, the adder circuit 1310 shown in FIG. 13 can be applied also to AG1 with no effect to the interleaving characteristics; i.e., AG2 could take the LFSR2 output directly, whereas AG1 could be implemented with the adder circuit.

As illustrated in FIG. 13, an interleaver 1300 comprises a first linear feedback shift register 1302. The first linear feedback shift register 1302 generates an input address sequence output 1304. A second linear feedback shift register 1306 provides an output 1308 to the adder circuit 1310. A constant C is also coupled to the adder circuit 1310. The adder circuit 1310 generates an output address sequence output 1312. A memory 1314 stores input data 1306 at memory addresses controlled by the input address sequence output 1304. The memory 1314 reproduces the input data 1306 at an interleaved sequence output 1308 controlled by the output address sequence 1312.

Figure 14:
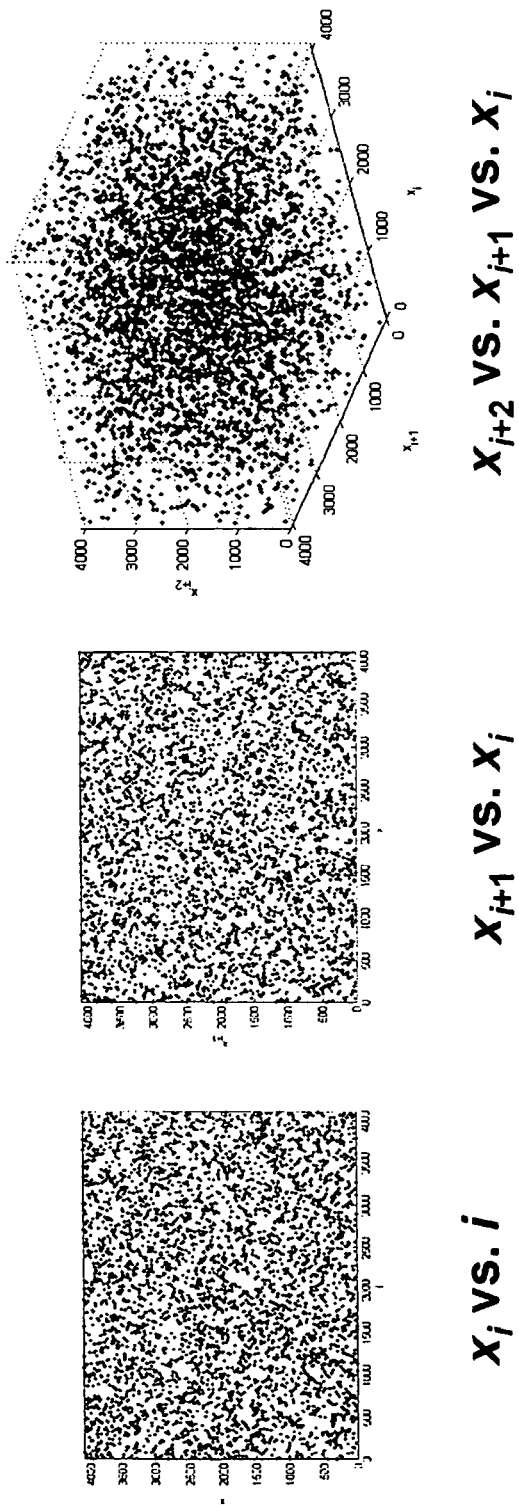
FIG. 14 illustrates mapping of interleaver outputs.

In FIG. 14, example characteristics of the enhanced LFSR method of FIG. 13 are illustrated. All three characteristics are uniformly distributed (like the characteristics shown for pseudo-random interleaving in FIG. 11) and show significant improvement when compared to the stand-alone LFSR characteristics in FIG. 12. The requirement for the adder circuit is justified by the fact that all LFSR sequences, even when generated with different primitive polynomials of the same degree, exhibit strong cross-correlation properties. Adding a constant to the LFSR output tends to decrease this correlation. The standard LFSR architecture produces a new address on each clock. Because of the structure of the LFSR, addresses are always 2x or 2x+1 (mod LFSR size) larger (or smaller, depending on a convention of how most and least significant bit positions are assigned) than the previous address. Adding a constant to the output of an LFSR generates addresses that cannot be created by the standard LFSR unless the constant equals 2x+1, a case that can only happen once per LFSR cycle. Therefore, the combination of the standard LFSR and the constant-offset LFSR remains quite uncorrelated, producing an interleaver that keeps initially adjacent bits well separated.

In the type of interleaver in FIG. 13, the adder circuit implementation is one example of enhancement of the LFSR interleaving process. Similar modifications to the output of the LFSR can be performed for example via replacing the adder circuit with XOR (exclusive-OR) operations on specific bit positions.

Figure 15:
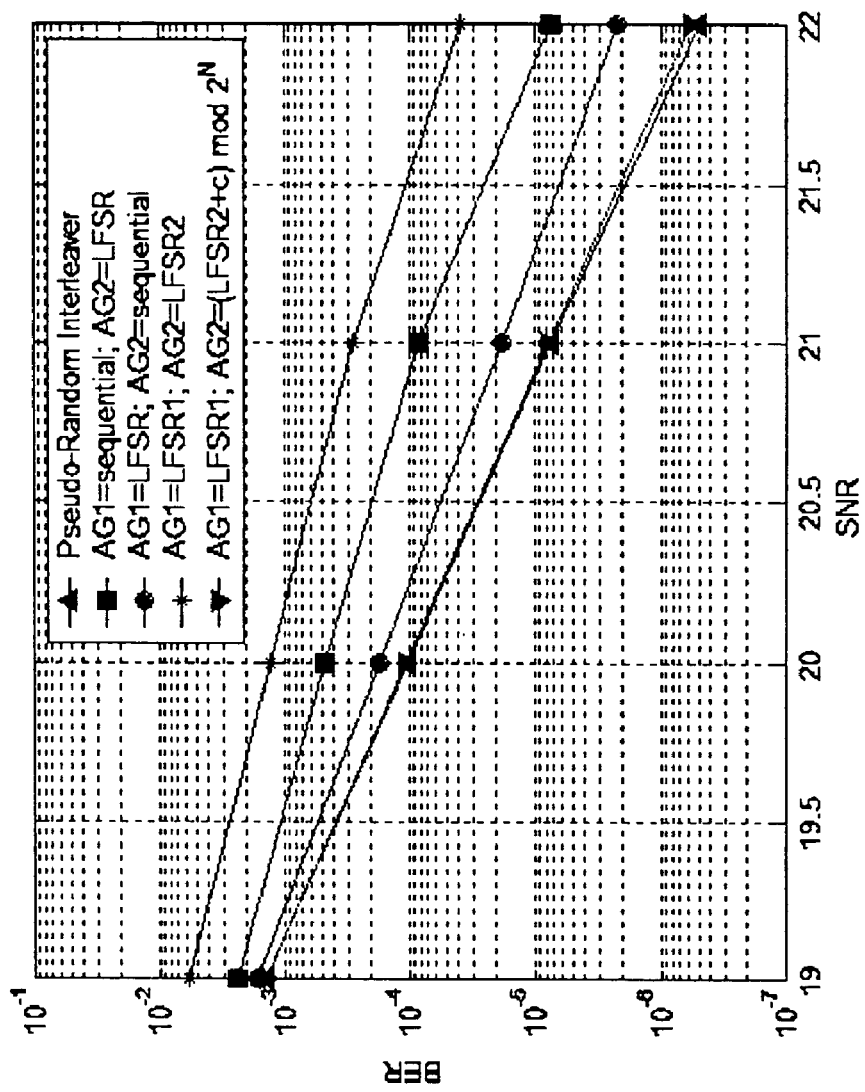
FIG. 15 illustrates output bit error rate (BER) as a function of signal-to-noise ratio for a communication channel that includes multiple-way interleavers.

To demonstrate the effectiveness of the interleaving architecture of FIG. 13, the iterative application example described above in connection with FIG. 9 using the interleaver described in FIG. 13 can be considered. The bit-error-rate (BER) vs. signal-to-noise ratio (SNR) plots are shown in FIG. 15. Four examples for the address generators AG1 and AG2 are:

1.) AG1=LFSR1; AG2=LFSR2; the input and output address generators are implemented with two different LFSRs. This configuration had limited performance improvement. This is due to the fact that even when two different LFSRs are used for address generation, the characteristics of the overall interleaver is still not uniformly distributed.

2.) AG1=sequential; AG2=LFSR; data was written into the memory sequentially and read out with the LFSR address generation. This performed better than the first case, but still was far off from the ideal pseudo-random interleaver case.

3.) AG1=LFSR; AG2=sequential; data was written into the memory with the LFSR address generation and read out sequentially. Performance improvement was noticed when compared to the previous case, but still not as good as the pseudo-random interleaver case.

4.) AG1=LFSR1; AG2=(LFSR2+c)mod $2^N$; this case is for the enhanced LFSR architecture of FIG. 13 and achieved near-optimum performance when compared to the ideal pseudo-random case.

Considering all four examples, the LFSR architecture "4.)" achieved near-optimum performance verifying the enhanced properties obtained via including an adder circuit at the LFSR output for one of the address generators of the interleaver memory.

FIGS. 16-22

Figure 16:
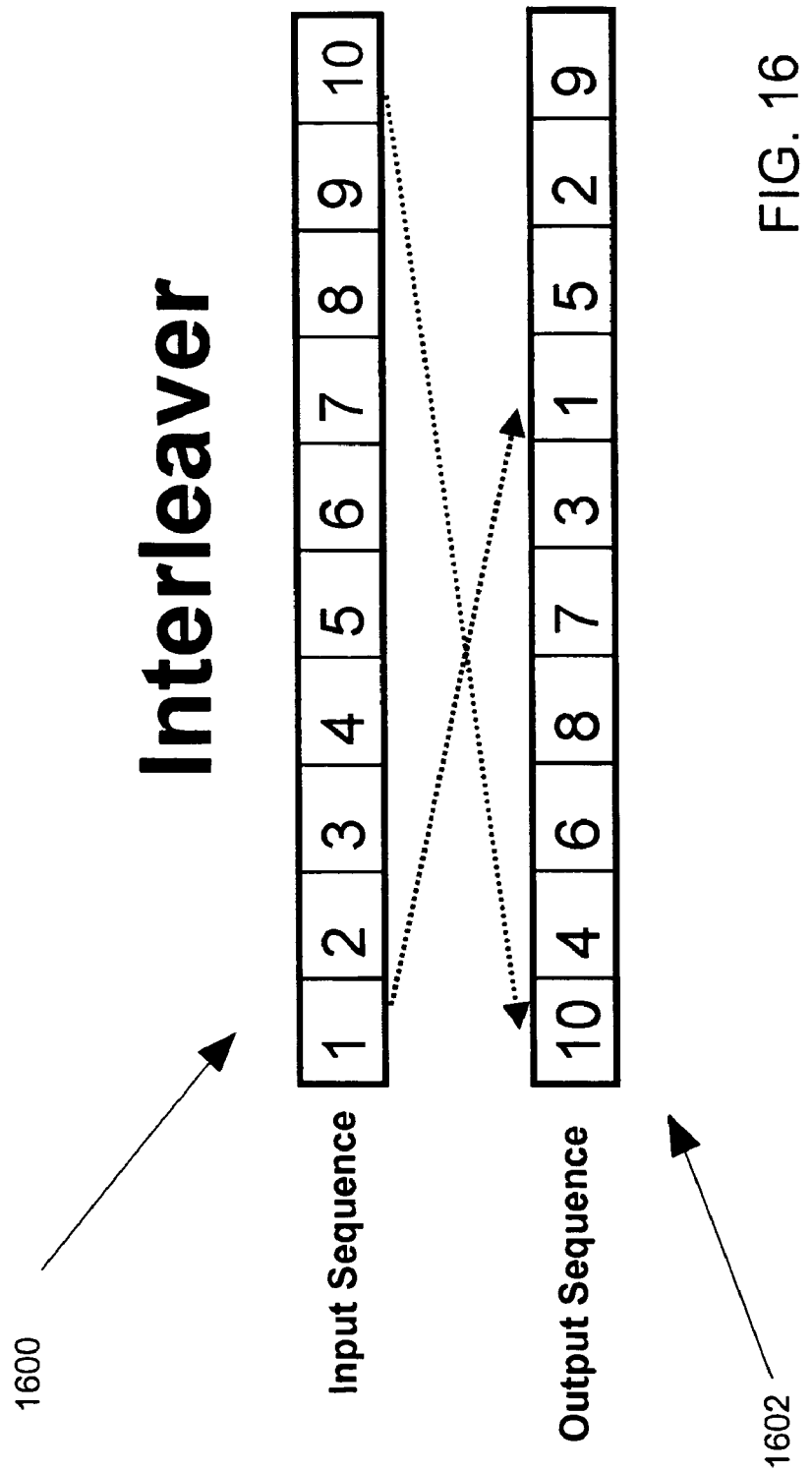
FIG. 16 illustrates input and output sequences of an interleaver.

Another type of interleaver is described below in FIGS. 16-22. As shown in FIG. 16, an interleaver takes an input sequence 1600 of m-bit symbols, and provide as an output sequence 1602 of the same symbols permuted in some fashion. A length N=10 interleaver is shown in FIG. 16, where the input sequence of symbols 1, 2, . . . , 10 are permuted to form the output sequence 10, 4, . . . , 9. There is a one-to-one mapping between the input and output symbols. For the most general class of interleavers, there is no constraint on the mapping—i.e. the last input symbol can be mapped to any output position, including the first output position. Since the last input symbol could potentially be the first output symbol, the entire sequence needs to be loaded into a length-N buffer before any symbols can be unloaded in the permuted order. A corresponding de-interleaver returns the permuted sequence to its original order. So for the example of FIG. 16, the de-interleaver would take the input sequence 10, 4, . . . , 9 and form the output sequence 1, 2, . . . , 10.

Figure 17:
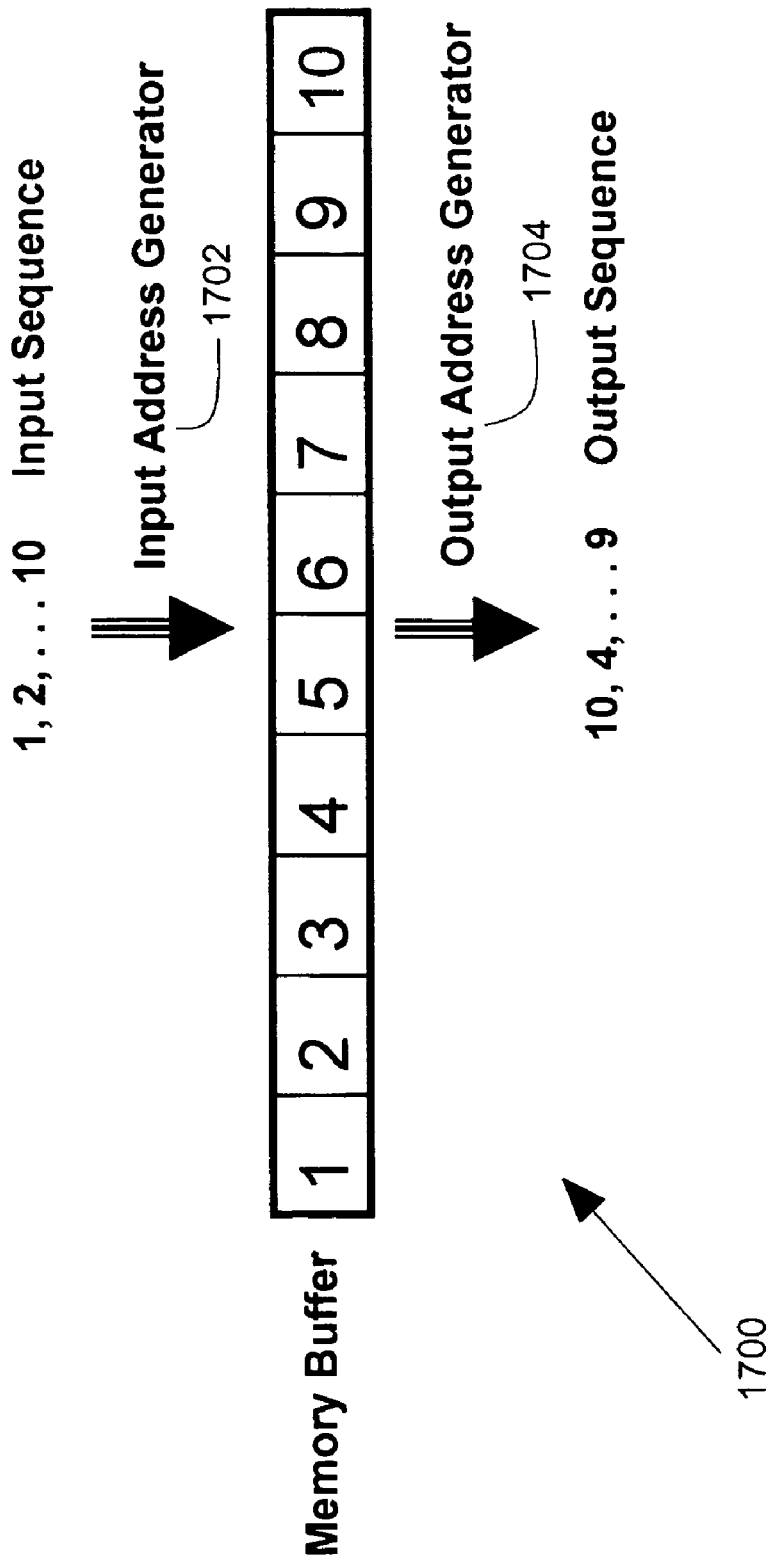
FIG. 17 illustrates a single buffered memory in an interleaver.

In FIG. 17, an example memory buffer 1700 for an interleaver is shown. Here the input sequence is loaded into the memory buffer using an input address generator 1702. After the entire Length-N input sequence is loaded into the buffer, the output sequence is generated using an output address generator 1704. In FIG. 17 the input address generator is sequential—the input sequence is loaded 20 sequentially into the memory buffer—but this does not need to be the case.

Figure 18:
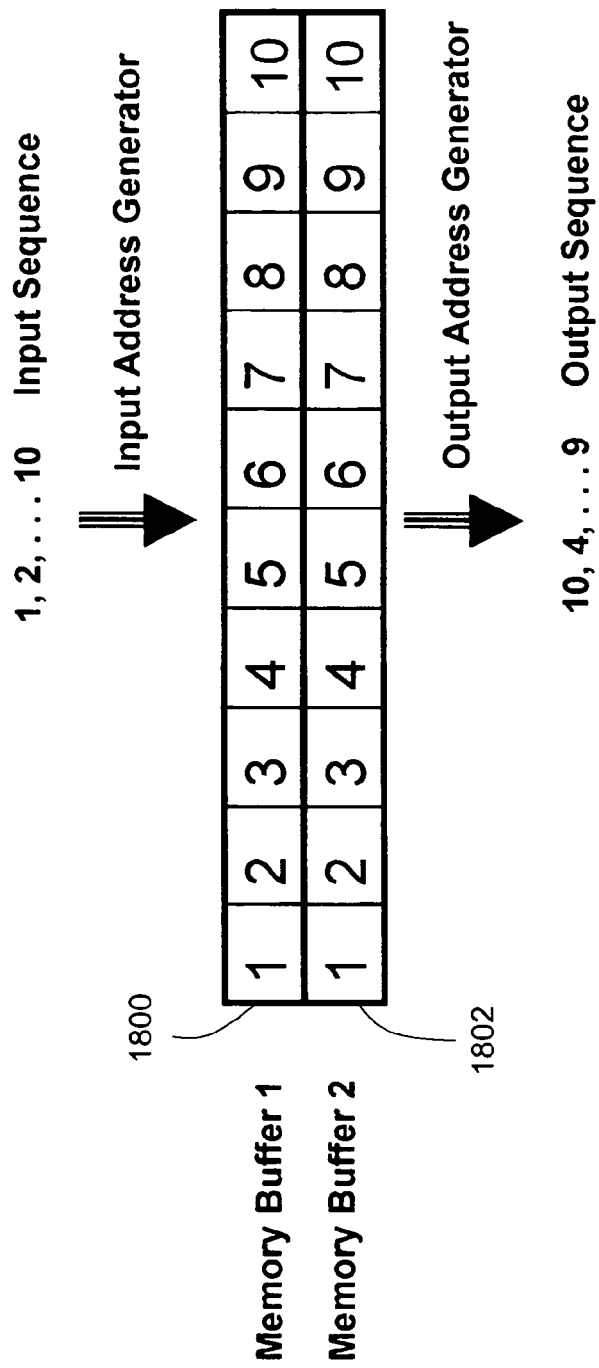
FIG. 18 illustrates a double buffered memory in an interleaver.

FIG. 18 illustrates using double buffering to achieve high data rates. While one block is loaded into a first buffer 1800, the previous block is unloaded from the second buffer 1802 in the permuted order.

Therefore, a high data rate pseudo-random interleaver uses memory capable of storing 2×N×m bits. The corresponding de-interleaver also uses memory capable of storing 2×N×m bits. In general, to achieve the predicted near-optimum performances of iterative codes, the block length N of the code needs to be very large. The result is that the interleaver (and de-interleaver) requires a large block of memory, and any reduction in this memory requirement improves the design. A method to re-use a single buffer and eliminate the need for double buffering, resulting in a factor of 2 decrease in memory required for each interleaver and de-interleaver in the system is described below.

Figure 19:
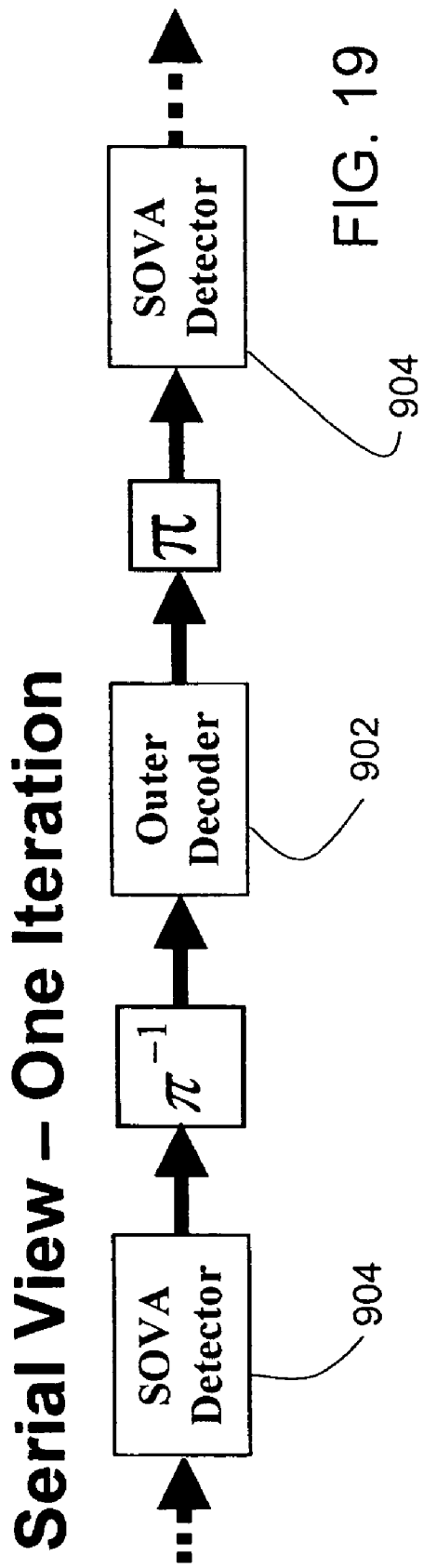
FIG. 19 illustrates a diagram of serial process steps on a single decoding iteration in the communication channel of FIG. 9.
Figure 20:
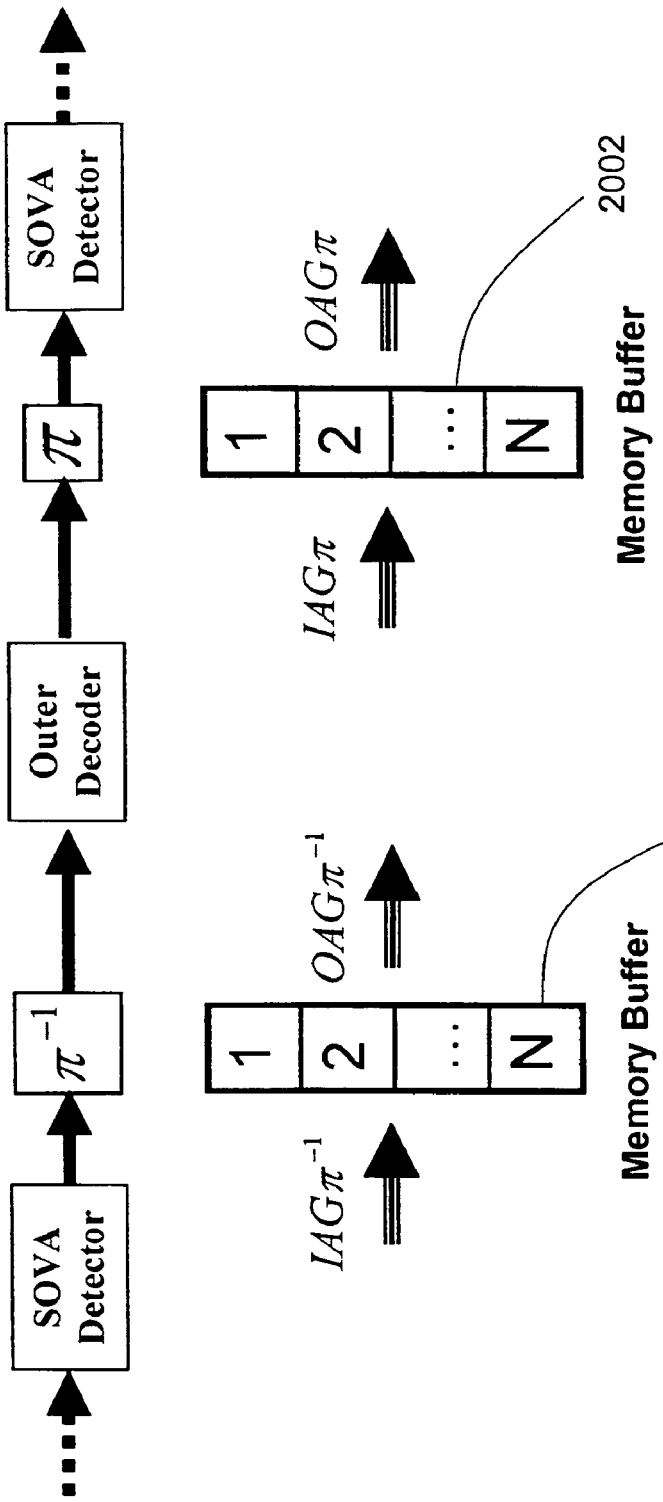
FIG. 20 illustrates a first method of loading and unloading data in a memory of an interleaver.

An iterative decoding block diagram for a recording channel is described above in connection with FIG. 9. A diagram of serial process steps of a single decoding iteration of FIG. 9 is shown in FIG. 19. Let $IAG\pi$=Input Address generator for interleaver
$OAG\pi$=Output Address generator for interleaver
$IAG\pi^{-1}$=Input Address generator for de-interleaver
$OAG\pi^{-1}$=Output Address generator for de-interleaver Ordinarily, the address generation would be as shown in FIG. 20, where each buffer 2000, 2002 is completely loaded before it can be unloaded, resulting in a significant decrease in throughput. Alternatively, each interleaver can be double buffered as discussed previously to maintain maximum throughput.

Figure 21:
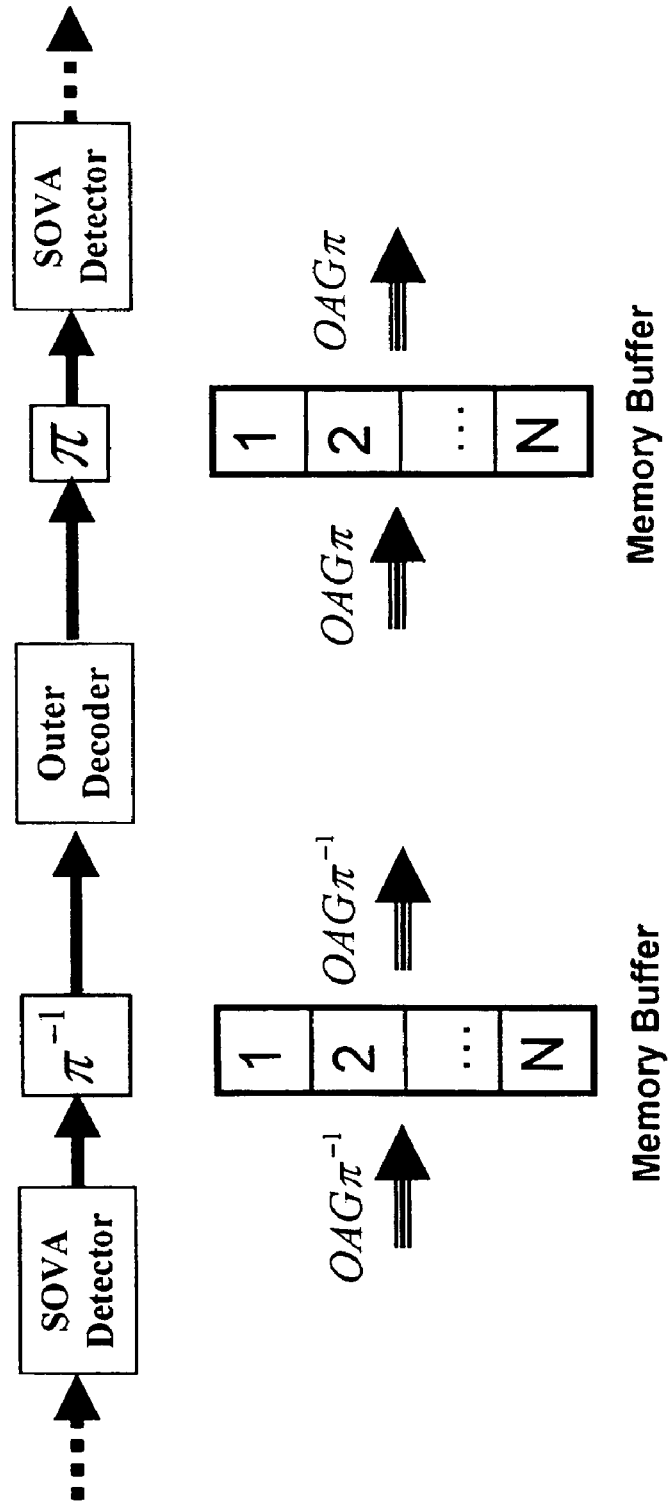
FIG. 21 illustrates a second method of loading and unloading data in a memory of an interleaver, one address at a time.

To maintain throughput without double buffering, each symbol unloaded from the memory buffer can be immediately replaced with a symbol on the input. As an example, assume the memory buffer is full. The output address generator chooses memory location 72 to be unloaded. On the input side, only location 72 is available in the memory buffer, so the input address generator should choose location 72. That is, $OAG\pi=IAG\pi$ and $OAG\pi^{-1}=IAG\pi^{-1}$ as shown in FIG. 21 is desired. Note that though the double buffering problem has been solved, the common input mapping and output mapping result in no permutation of the sequence. That is, there is now effectively no interleaving at all.

Figure 22:
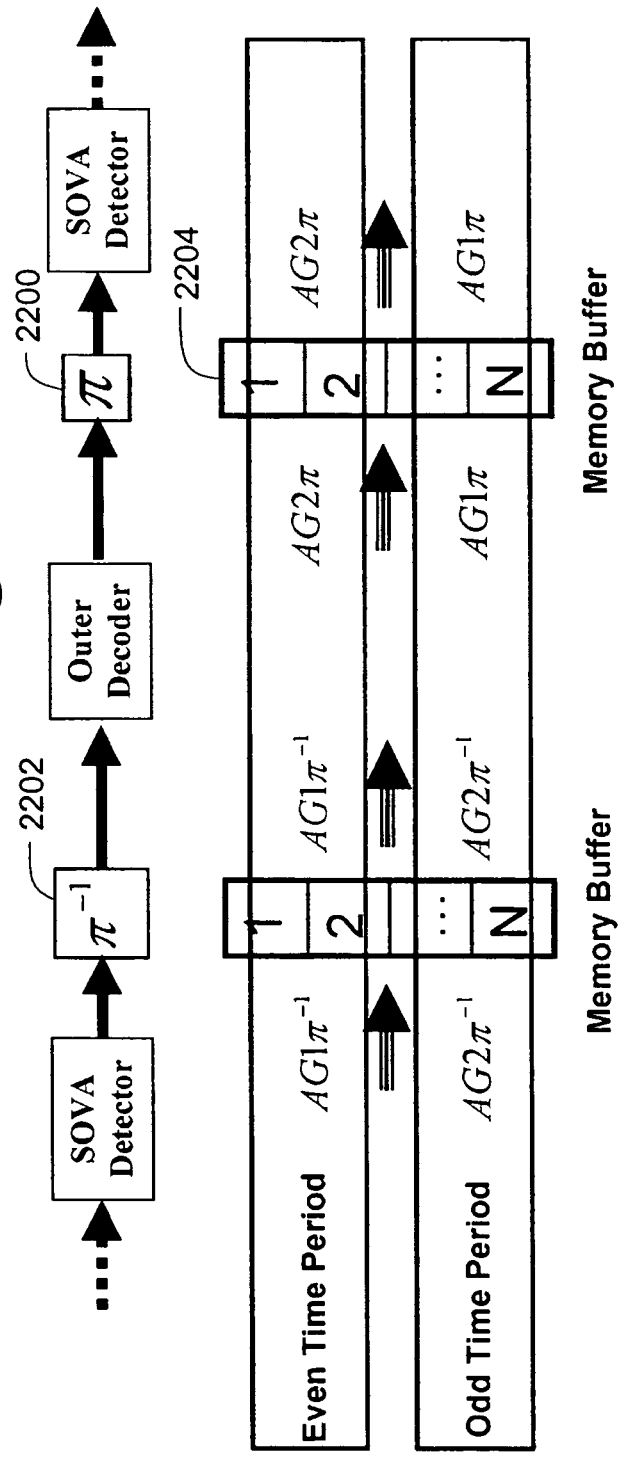
FIG. 22 illustrates a first sequence of loading and unloading data in an interleaver and a deinterleaver.

The solution is to load the buffer with one address generator and to unload it with the same address generator, but to alternate address generators such that each block is interleaved as shown in FIG. 22.

In FIG. 22, An interleaver 2200 (or a deinterleaver 2202) comprises an address sequence generator that generates an input address sequence during an even time period and an output address sequence during an odd time period following the even time period such that output addresses are time interleaved between input addresses. In other words, the input address sequence alternates in time with the output address sequence, one address at a time.

The interleaver 2200 (or deinterleaver 2202) includes a memory 2204 that stores data at multiple data addresses controlled by the input address sequence. The memory 2204 reproduces the data in an interleaved sequence controlled by the output address sequence. Reproduction of data from any designated data address is followed by storage of successive data in that designated data address, one address at a time.

Let a time period be the time required to load one block of data into the memory buffer. This same time period is the time required to unload one block of data from the memory buffer. Since the same address generator is used to load and unload the memory buffer for any time period, throughput is maintained without double buffering. But since each block of data is loaded and unloaded using a different address generator, each block is permuted and de-permuted as required.

This is evident from the example in FIG. 22. Let Data Block 1 be loaded into the first memory buffer using $AG1\pi^{-1}$. This is accomplished during an even time period. During the next odd time period, Block 1 is unloaded from the first memory buffer using $AG2\pi^{-1}$. The effective de-interleaver is $AG1\pi^{-1} \times AG2\pi^{-1}$. During the next even time period, Block 1 is loaded into the second memory buffer using $AG2\pi$. Finally, during the next odd time period, Block 1 is unloaded from the second memory buffer using $AG1\pi$. The effective interleaver is $AG2\pi \times AG1\pi$, as required to get the original sequence. A similar explanation holds for a block beginning during an odd time period. The symbolic statement of the type "A×B" here refers to the resulting interleaving when data is loaded into memory using an address generator A and unloaded from memory using an address generator B, where address generator A and B outputs are sequentially applied to memory address inputs interleaved one address at a time.

This solution results in a 2× decrease in memory while maintaining maximum throughput. The only complexity increase is the requirement to toggle address generators for even and odd data blocks.

Further complexity reduction can be obtained by noting that the sequential address generator accesses data in the order it is received, that is $AG\pi=AG_\pi^{-1}=1$. Using the sequential address generator for AG1 in the example of FIG. 22 results in an effective de-interleaver of $AG1\pi^{-1} \times AG2\pi^{-1}=AG2\pi^{-1}$ and an effective interleaver of $AG2\pi \times AG1\pi=AG2\pi$.

FIGS. 23-30

One enabling component of the high performance of iterative codes for communications systems and data storage devices is the random interleaver/de-interleaver (also called data shuffler or permuter) that is placed between two or more constituent encoders/decoders, or between an outer code and a channel detector. To achieve the predicted near-optimum performances of iterative codes, usually the block length of the data (i.e., bits or symbols) and the size of the interleaver have to be very large. From an implementation point-of-view, this requires a huge memory block and also slows down the processing speed of the data due to delays caused by the large interleaver. Here, two methods that enable efficient, fast, and low-complexity interleaving via the utilization of interleaving of small sub-blocks are shown. Performance achieved with these two methods are either close to, or even outperforming other more complex pseudo-random interleavers that usually operate on the whole block of data.

A random interleaver is a component that generates a pseudo-random output position for each input position of the data. Basically, this is a mapping of input position i to output position $x_i$, where $x_i$ is ideally a uniformly distributed random number. Here $i=0, \ldots, n-1$, where n denotes the block size (or length) of the data (i.e., bits or symbols) to be interleaved/permuted.

Figure 23:
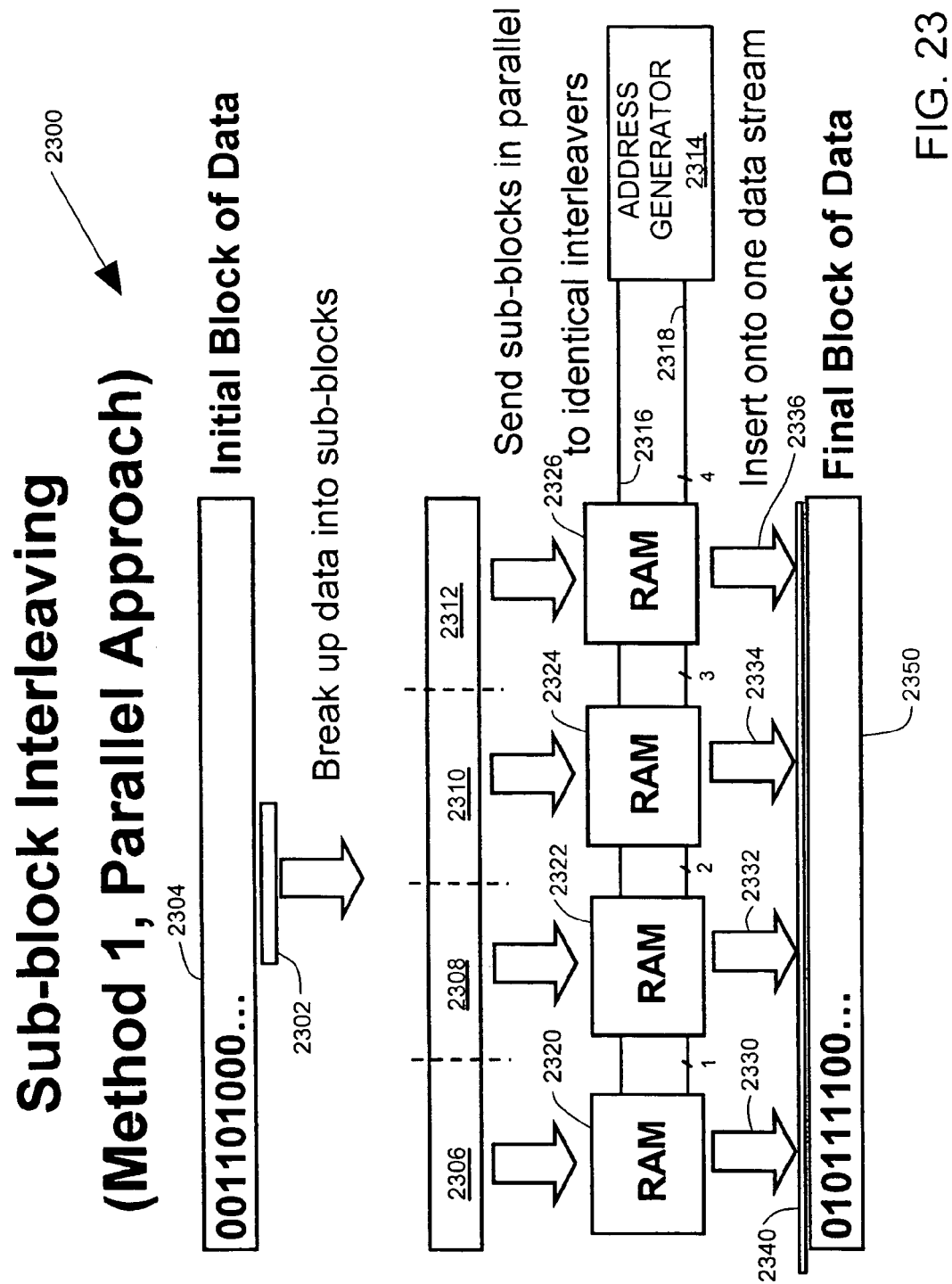
FIG. 23 illustrates a block diagram of an interleaver with parallel features.

To enable an efficient interleaver with low implementation complexity, two methods can be used:

Method 1: The first method breaks up the block of data to be interleaved into sub-blocks and interleaves on the sub-block level with identical interleavers for each sub-block. This can be done in either a serial or parallel architecture. In FIG. 23, a parallel implementation example is shown, where the block of data is first arranged in four sub-blocks, and then an identical interleaver is used on each of the sub-blocks. In FIG. 23, the interleaver can be any kind of pseudo-random interleaver constructed algebraically or via any search algorithm. It should be pointed out that the four sub-block implementation here is only one example and that this can be generalized to any number of sub-blocks.

In FIG. 23, an interleaver 2300 comprises an input multiplexer 2302 that receives a data sequence 2304 at an interleaver input. The input multiplexer 2302 separates the data sequence 2304 into multiple data sub-blocks 2306, 2308, 2310, 2312.

An address generator 2314 generates an input address sequence 2316 and an output address sequence 2318. Memories 2320, 2322, 2324, 2326 store the data sub-blocks 2306, 2308, 2310, 2312 at addresses controlled by the input address sequence 2316. The memories 2320, 2322, 2324, 2326 reproduce each data sub-block in an interleaved sequence output 2330, 2332, 2334, 2336 controlled by the output address sequence 2318. An output multiplexer 2340 assembles the interleaved sequences 2330, 2332, 2334, 2336 to provide an interleaver output 2350.

Figure 24:
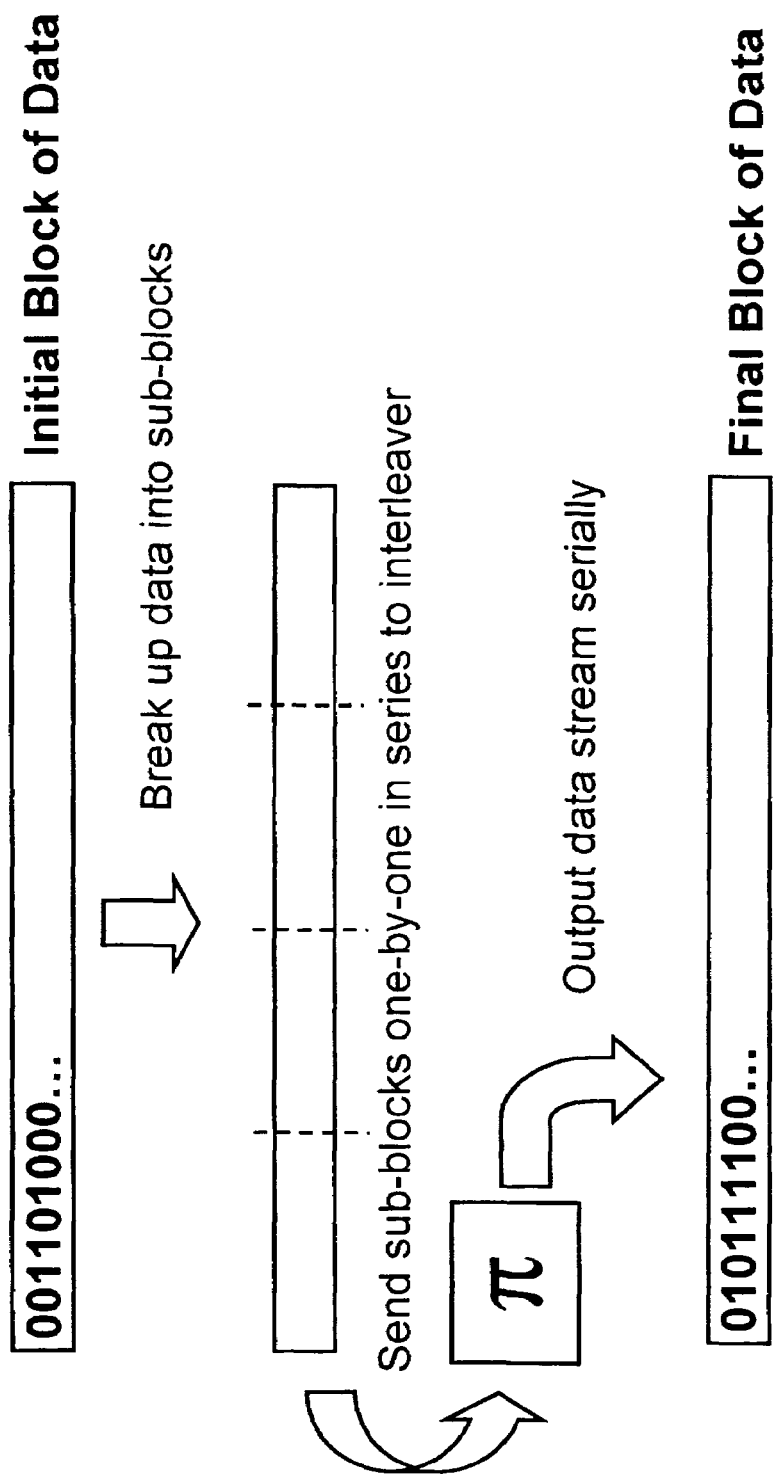
FIG. 24 illustrates a block diagram of an with serial features.
Figure 25:
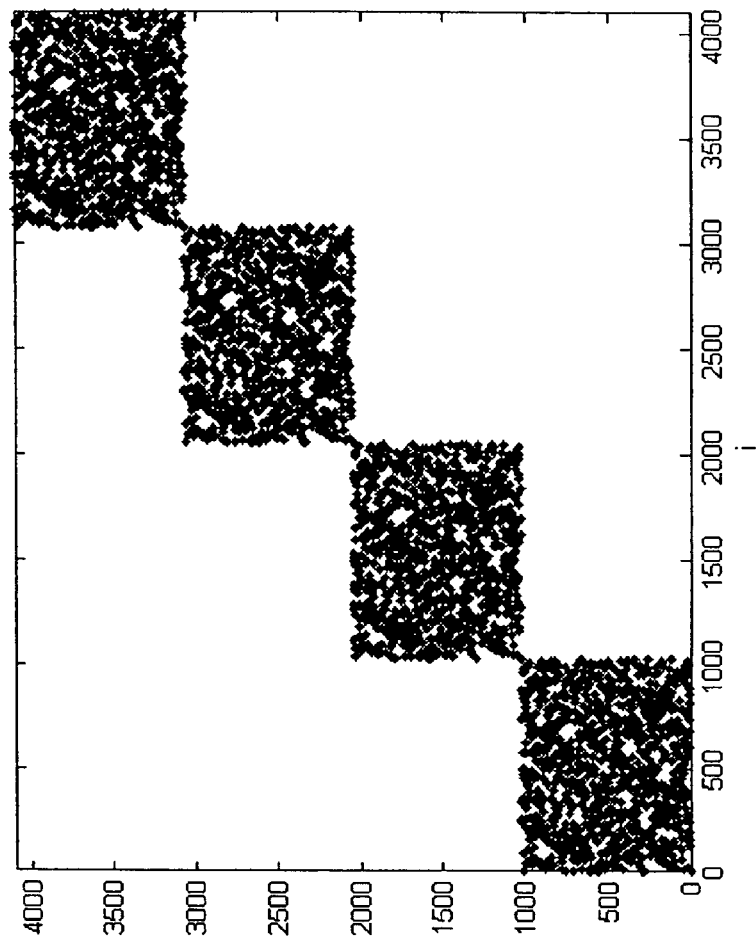
FIG. 25 illustrates mapping of interleaver outputs

In FIG. 24, the same implementation is shown in a serial approach. In FIG. 25, the scatter plot (i.e., $x_i$ vs. i ) plot is shown for data of block length 4096 and four sub-blocks. It is observed that the data is permuted/shuffled within each sub-block.

For method 1, identical interleavers are used for each sub-block to lower the implementation complexity. Nevertheless, this is not a limitation, but a preference; i.e., in general, one can also apply different random interleavers for each sub-block.

Method 2: The second method performs initially an m-way interleaving on the block of data, where m is an integer; m-way interleaving refers to the case where the data is interleaved onto m sub-blocks in a row-column fashion. This can be visualized as follows: Let n denote the length of the data to be interleaved and let m be a divisor of n. One possible way of implementing m-way interleaving is to write the data row-wise into a two dimensional array with m columns and n/m rows. After this, the data is read out column-wise to obtain the m-way interleaved data.

Figure 26:
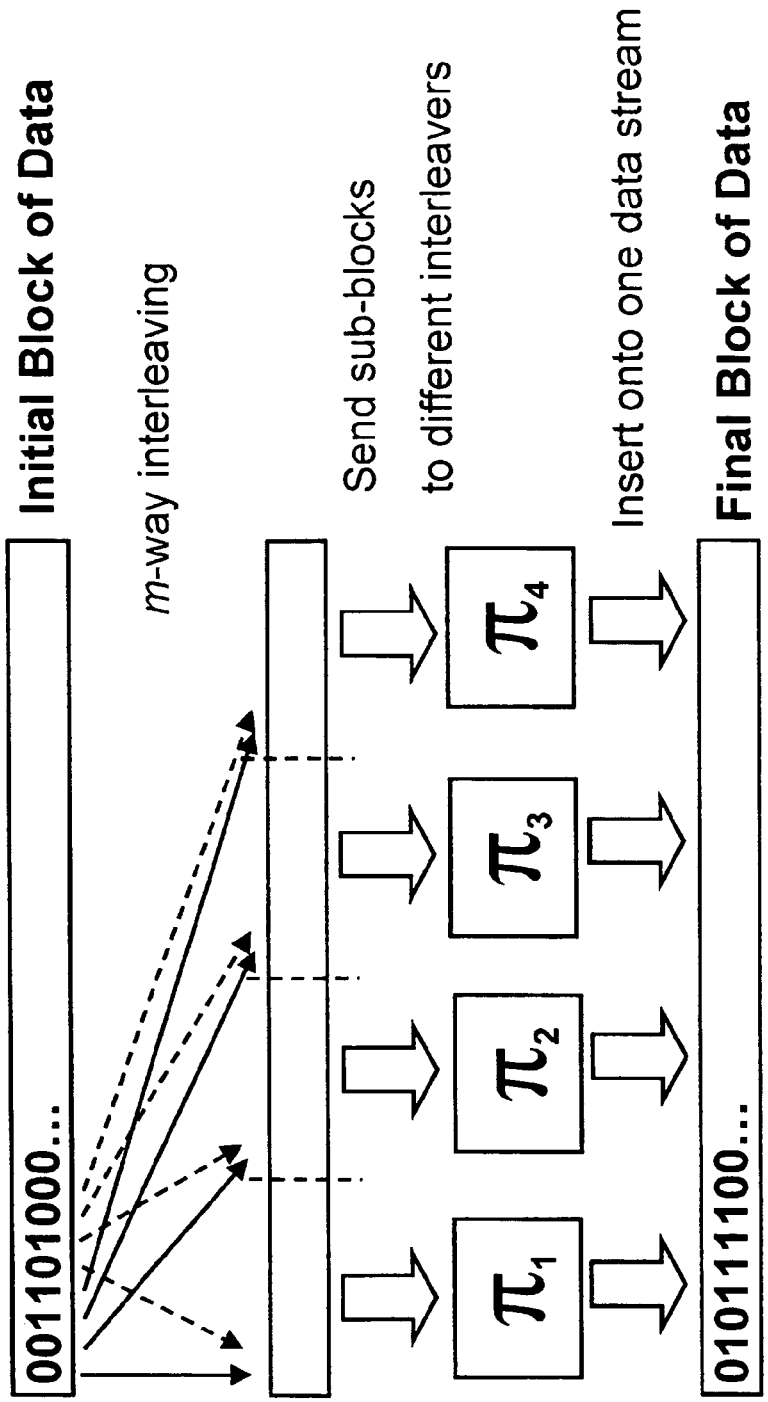
FIG. 26 illustrates a block diagram of an interleaver.
Figure 27:
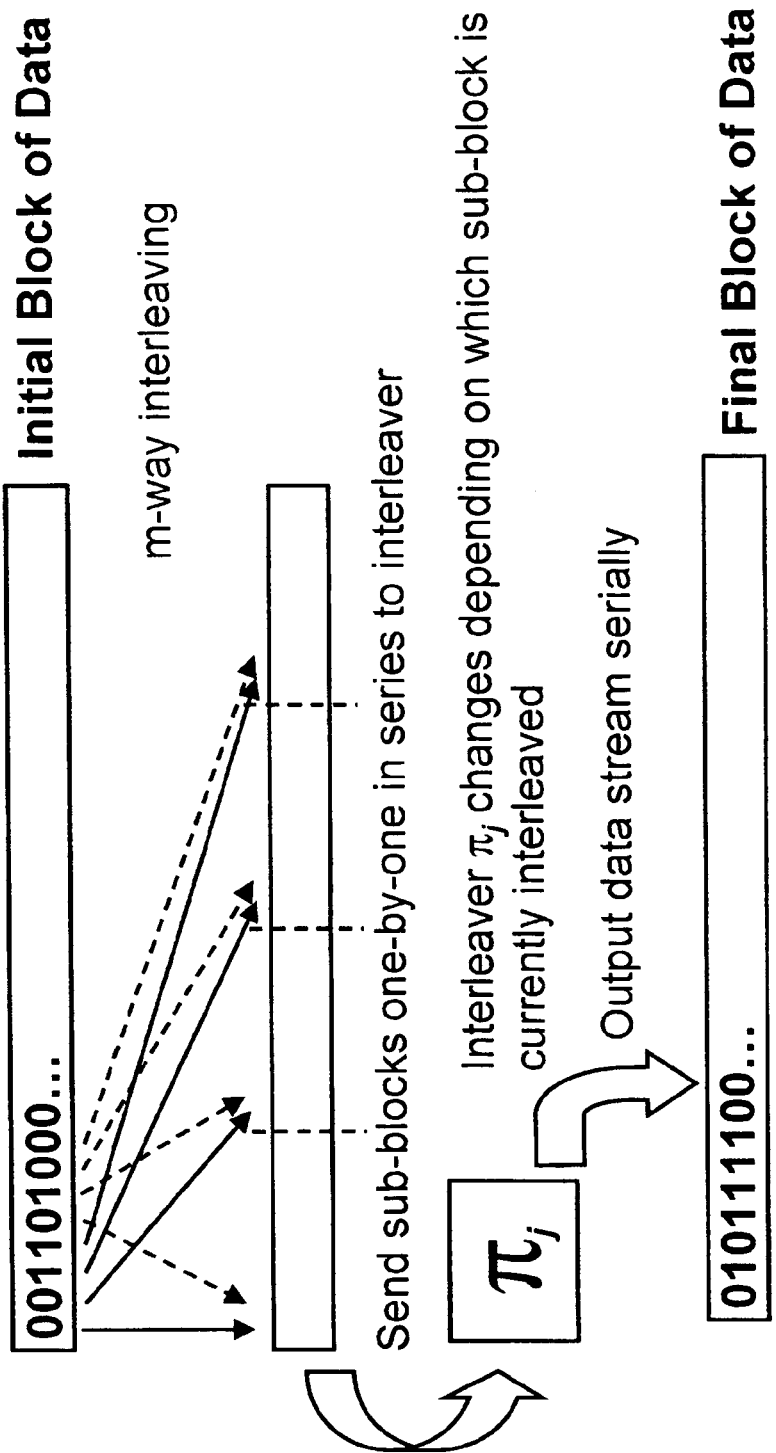
FIG. 27 illustrates a block diagram of an interleaver.
Figure 28:
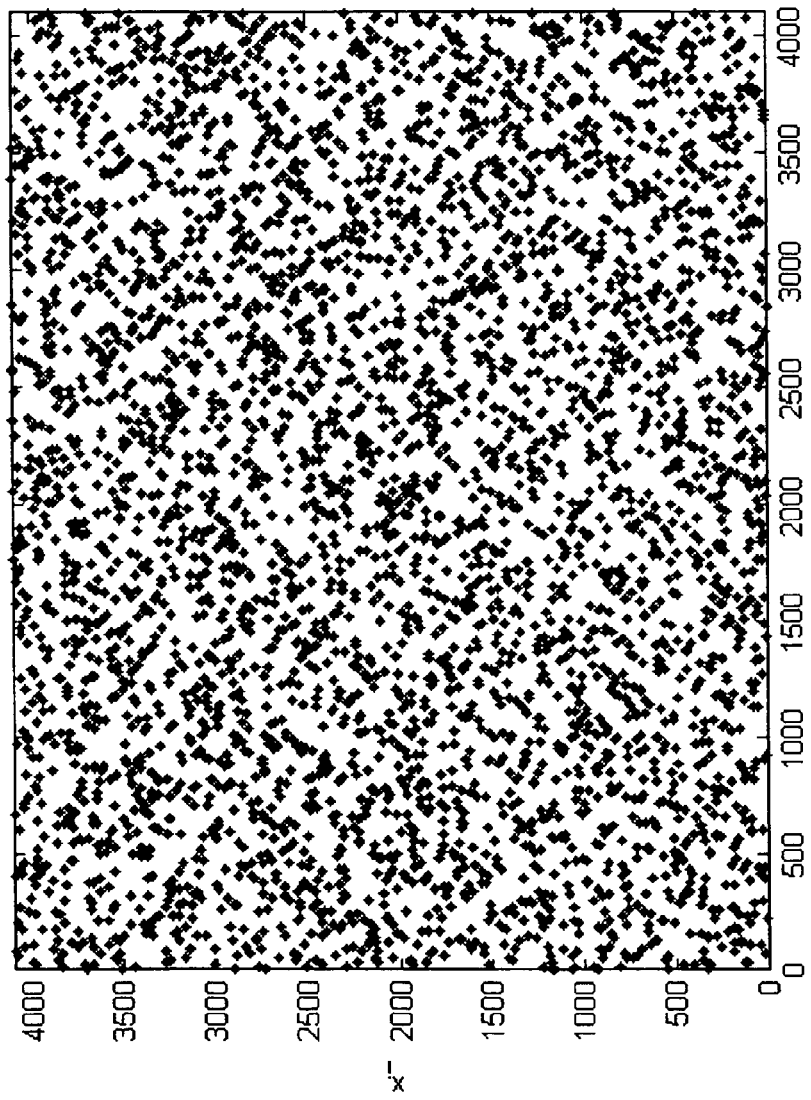
FIG. 28 illustrates output bit error rate (BER) as a function of signal-to-noise ratio for a communication channel that includes multiple-way interleavers.
Figure 29:
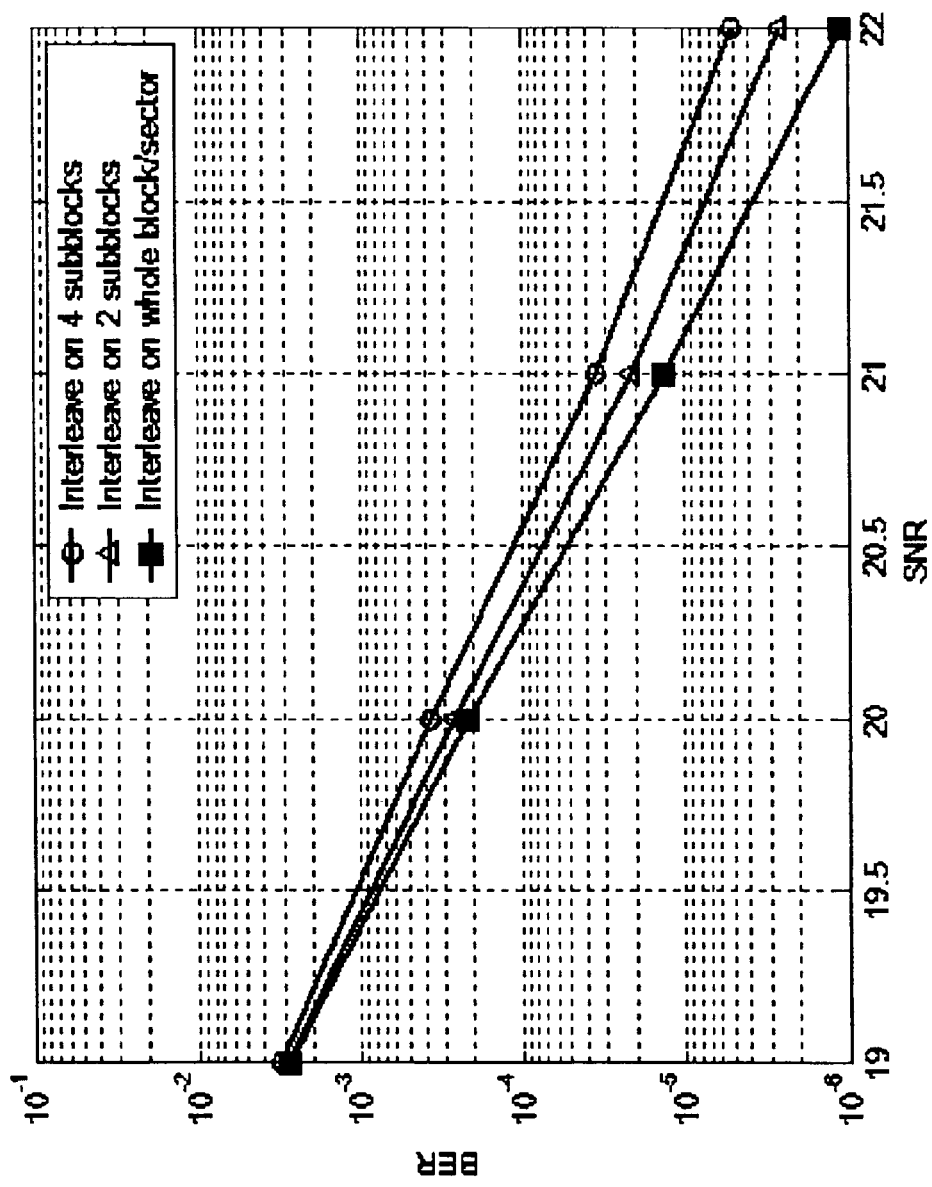
FIG. 29 illustrates output bit error rate (BER) as a function of signal-to-noise ratio for a communication channel that includes multiple-way interleavers.

After the m-way interleaving has been performed, different interleavers for each sub-block are employed to obtain the final interleaved block of data. As for method 1, method 2 can be also implemented in a parallel or serial architecture as shown for the m=4 case in FIGS. 26, 27, respectively. In FIG. 28, the scatter plot (i.e., $x_i$ vs. i ) plot is shown for data of block length 4096 and four sub-blocks (m=4). To reduce the complexity of the interleaver, the number of sub-blocks and the m value are the same, but they do not have to be.

Figure 30:
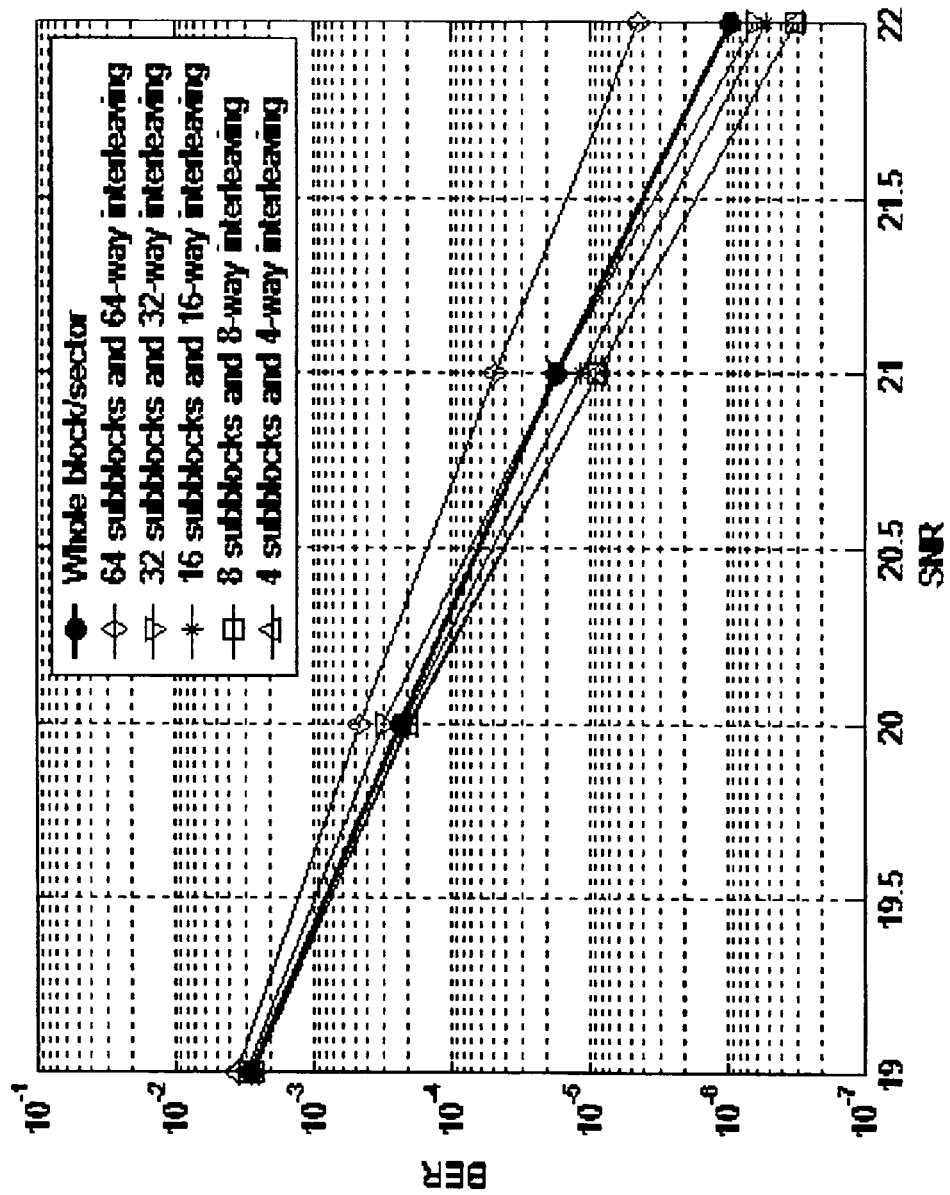
FIG. 30 illustrates output bit error rate (BER) as a function of signal-to-noise ratio for a communication channel that includes multiple-way interleavers.

To demonstrate the effectiveness of the proposed interleaving architecture, the iterative coding application example as described above in connection with FIG. 9 is considered. Here, interleavers and de-interleavers are denoted by $\pi$ and $\pi^{-1}$, respectively. A global iteration is defined as the (extrinsic) soft information exchange between the outer decoder and the channel detector. The channel detector is a soft-input soft-output (SISO) detector/decoder that can be implemented using the soft-output Viterbi algorithm (SOVA), BCJR algorithm, or any other soft-output algorithm that is able to provide reliability information. In FIG. 30, the bit-error-rate (BER) vs. signal-to-noise ratio (SNR) for Method 1 (block length of n=4096) and two global iterations reveals that there is a reasonable performance degradation when going from whole sector interleaving to sub-block interleaving with two or four sub-blocks; i.e., there exists a trade-off for performance of the system vs. complexity of the interleaver.

FIG. 30 shows the BER vs. SNR for Method 2; i.e., performance results for m-way interleaving combined with sub-block interleaving for m=4, 8, 16, 32, and 64 are shown. For this particular example with block length of n=4096, for up to m=32, Method 2 performs about the same or even better when compared to interleaving the whole block. This demonstrates the benefit of using this interleaving approach.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the communication system while maintaining substantially the same functionality without departing from the scope and spirit of the present invention. In addition, although the preferred embodiment described herein is directed to a data storage system for reading & writing data, it will be appreciated by those skilled in the art that the teachings of the present invention can be applied to other communication channels, without departing from the scope and spirit of the present invention.

What is claimed is:

1. An interleaver, comprising:
   an input multiplexer receiving a data sequence at an interleaver input and separating the data sequence into multiple data sub-blocks;
   a first linear feedback shift register generating an input address sequence;
   adder circuits generating an output address sequence associated with each data sub-block;
   memory that stores the data sub-blocks at addresses controlled by the input address sequence, the memory reproducing each data sub-block in an interleaved sequence controlled by the associated output address sequence; and an output multiplexer assembling the interleaved sequences to provide an interleaver output.

2. The interleaver of claim 1 wherein the adder circuits receive an output from the first linear feedback shift register.

3. The interleaver of claim 1, further comprising:
a second linear feedback shift register generating a shift register output coupling to the adder circuits.

4. The interleaver of claim 3 wherein the second linear feedback shift register generates an output LFSR2 and the output address sequence AG2 is of the form:

$$AG2=(LSFR2+C) \bmod 2^N$$

where C is a fixed constant and N is the degree of the primitive polynomial with which the LFSR was constructed, and LFSR2 denotes a decimal equivalent of a linear feedback shift register state.

5. The interleaver of claim 1 wherein the input address sequence alternates with the output address sequence one address at a time, and a memory reproduction of data from any designated data address is followed by a memory storage of successive data in that same designated data address one address at a time.

6. The interleaver of claim 1 wherein the first linear feedback shift register is implemented with a primitive polynomial of degree N.

7. The interleaver of claim 1 wherein the first linear feedback shift register generates addresses from 1 through $2^N-1$.

8. The interleaver of claim 7 and further comprising a circuit generate a zero address.

9. The interleaver of claim 1 wherein the first linear feedback shift register generates an output LFSR and the output address sequence AG2 is of the form:

$$AG2=(LSFR+C_k) \bmod L$$

where Ck is a constant associated with the kth data sub-block, L is a sub-block length, and LFSR denotes a decimal equivalent a linear feedback shift register state.

10. A method of data interleaving, comprising:
receiving a data sequence at an interleaver input and separating the data sequence into multiple data sub-blocks;
generating an input address sequence with a first linear feedback shift register;
generating an output address sequence associated with each data sub-block;
storing the data sub-blocks at memory addresses controlled by the input address sequence;
reproducing each data sub-block in an interleaved sequence controlled by the associated output address sequence; and
assembling the interleaved sequences to provide an interleaver output.

11. The method of claim 10 and generating the output address sequence using adder circuits that receive an output from the first linear feedback shift register an.

12. The method of claim 11, further comprising:
generating a shift register output coupling to the adder circuits using a second linear feedback shift register.

13. The method of claim 12 and the second linear feedback shift register generating an output LFSR2 and the output address sequence AG2 is of the form:

$$AG2=(LSFR2+C) \bmod 2^N$$

where C is a fixed constant and N is a degree of a primitive polynomial with which the LFSR is constructed, and LFSR2 denotes a decimal equivalent of a linear feedback shift register state.

14. The method of claim 10 and further comprising:
alternating the input address sequence with the output address sequence one address at a time, and
reproducing data from any designated data address followed by storing of successive data in that same designated data address one address at a time.

15. The method of claim 10, further comprising:
implementing the first linear feedback shift register with a primitive polynomial of degree N.

16. The method of claim 10 further comprising: generating addresses from 1 through $2^N-1$ using the first linear feedback register.

17. The method of claim 16 further comprising:
generating a zero address with a zero address circuit.

18. The method of claim 10 further comprising:
generating an output LFSR of the first linear shift register with an output address sequence AG2 is of the form:

$$AG2=(LSFR+C_k) \bmod L$$

where Ck is a constant associated with the kth data sub-block, L is a sub-block length, and LFSR denotes a decimal equivalent of a linear feedback shift register state.

19. An interleaver, comprising:
an input multiplexer receiving a data sequence at an interleaver input and separating the data sequence into multiple data sub-blocks;
linear feedback shift register means for generating an input address sequence;
adder circuits generating an output address sequence associated with each data sub-block;
memory that stores the data sub-blocks at addresses controlled by the input address sequence, the memory reproducing each data sub-block in an interleaved sequence controlled by the associated output address sequence; and
an output multiplexer assembling the interleaved sequences to provide an interleaver output.

20. The interleaver of claim 19 wherein the adder circuits receive an output from the linear feedback shift register means.

* * * * *